(12) United States Patent
Chiba et al.

(10) Patent No.: US 11,972,798 B2
(45) Date of Patent: Apr. 30, 2024

(54) VARIABLE RESISTANCE NONVOLATILE MEMORY

(71) Applicant: KIOXIA CORPORATION, Tokyo (JP)

(72) Inventors: Tomoki Chiba, Fujisawa Kanagawa (JP); Daisaburo Takashima, Yokohama Kanagawa (JP); Hidehiro Shiga, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 139 days.

(21) Appl. No.: 17/681,680

(22) Filed: Feb. 25, 2022

(65) Prior Publication Data
US 2023/0065167 A1 Mar. 2, 2023

(30) Foreign Application Priority Data
Aug. 31, 2021 (JP) ................................. 2021-141693

(51) Int. Cl.
*G11C 11/00* (2006.01)
*G11C 13/00* (2006.01)

(52) U.S. Cl.
CPC ........ *G11C 13/004* (2013.01); *G11C 13/0026* (2013.01); *G11C 13/0028* (2013.01); *G11C 13/0038* (2013.01); *G11C 13/0069* (2013.01)

(58) Field of Classification Search
CPC .............. G11C 13/004; G11C 13/0026; G11C 13/0028; G11C 13/0038; G11C 13/0069; G11C 13/0061; G11C 2213/71; G11C 2213/75
See application file for complete search history.

(56) References Cited

U.S. PATENT DOCUMENTS

| 9,025,369 B2* | 5/2015 | Takashima | H10N 70/8825 365/158 |
| 2013/0100754 A1* | 4/2013 | Asaoka | G11C 16/3404 365/222 |
| 2014/0145137 A1* | 5/2014 | Ju | H10B 63/84 257/2 |
| 2014/0211539 A1* | 7/2014 | Kanno | G11C 13/0069 365/148 |
| 2020/0403035 A1 | 12/2020 | Ogiwara et al. | |
| 2022/0109024 A1* | 4/2022 | Ogiwara | G11C 13/0004 |

FOREIGN PATENT DOCUMENTS

JP 2021-002629 A 1/2021

\* cited by examiner

*Primary Examiner* — Hien N Nguyen
(74) *Attorney, Agent, or Firm* — Kim & Stewart LLP

(57) ABSTRACT

A nonvolatile memory includes a first memory cell and a second memory cell above the first memory cell. The first memory cell includes a variable resistance layer extending in a first direction, a semiconductor layer extending in the first direction and in contact with the variable resistance layer, an insulator layer extending in the first direction and in contact with the semiconductor layer, and a first voltage applying electrode extending in a second direction and in contact with the insulator layer. The second memory cell includes a second voltage applying electrode in contact with the insulator layer. When a write operation is performed on the first memory cell, a first voltage is applied to the second voltage applying electrode, and when a write operation is performed on the second memory cell, a second voltage, lower than the first voltage, is applied to the first voltage applying electrode.

20 Claims, 21 Drawing Sheets

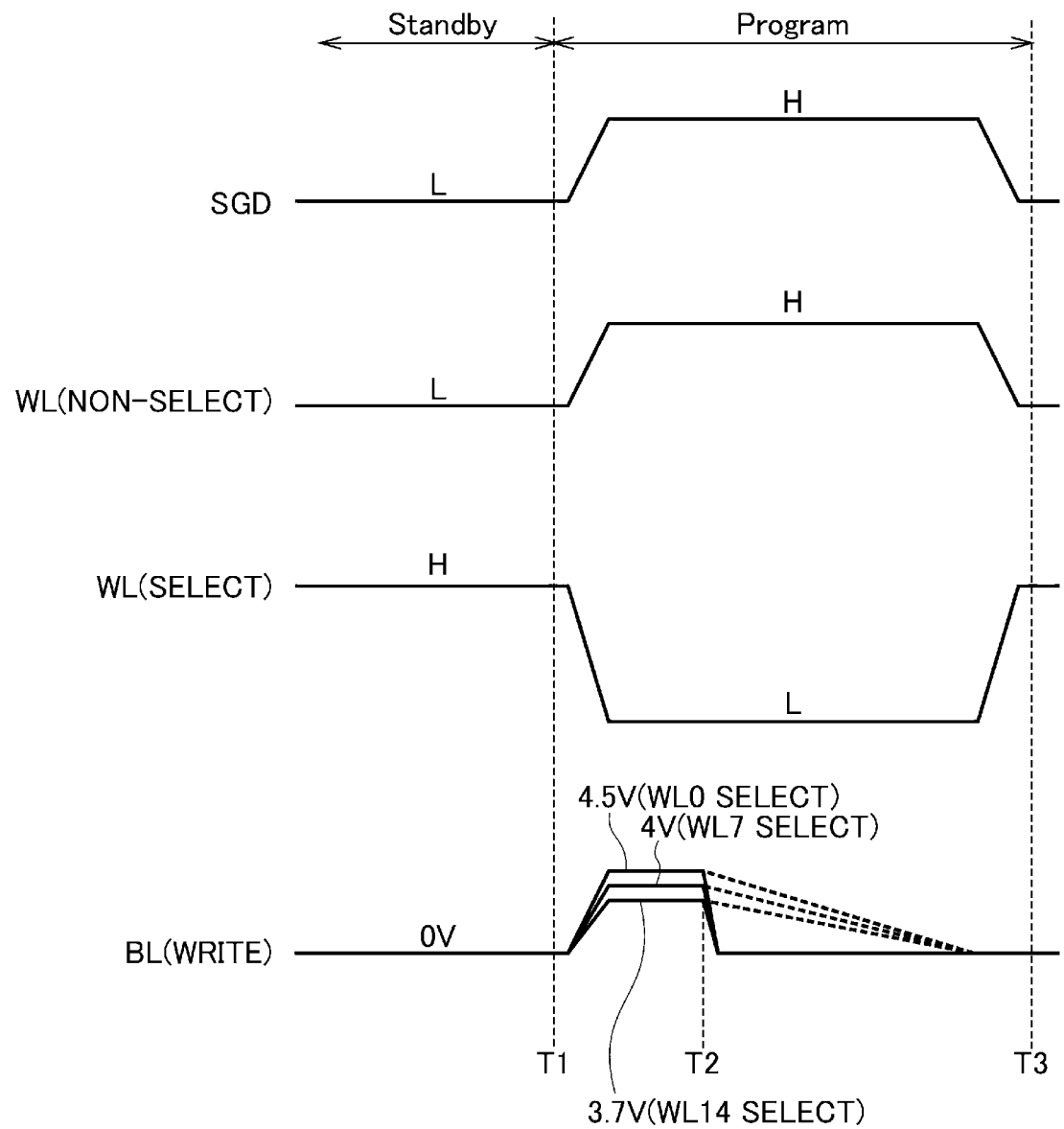

VARIABLE RESISTANCE NONVOLATILE MEMORY

CROSS-REFERENCE TO RELATED APPLICATION

This application is based upon and claims the benefit of priority from Japanese Patent Application No. 2021-141693, filed Aug. 31, 2021, the entire contents of which are incorporated herein by reference.

FIELD

Embodiments described herein relate generally to a variable resistance nonvolatile memory.

BACKGROUND

A variable resistance nonvolatile memory in which variable resistance storage elements such as a resistive random access memory (ReRAM) element, an alloy-type phase change memory (PCM) element, and an interfacial phase change memory (iPCM) element are integrated on a semiconductor substrate is being developed.

DESCRIPTION OF THE DRAWINGS

FIG. 25 is a diagram illustrating a program operation waveform when the bit line voltage changes depending on the position of the selected word line in the variable resistance nonvolatile memory according to the second embodiment.

DETAILED DESCRIPTION

Figure 1:
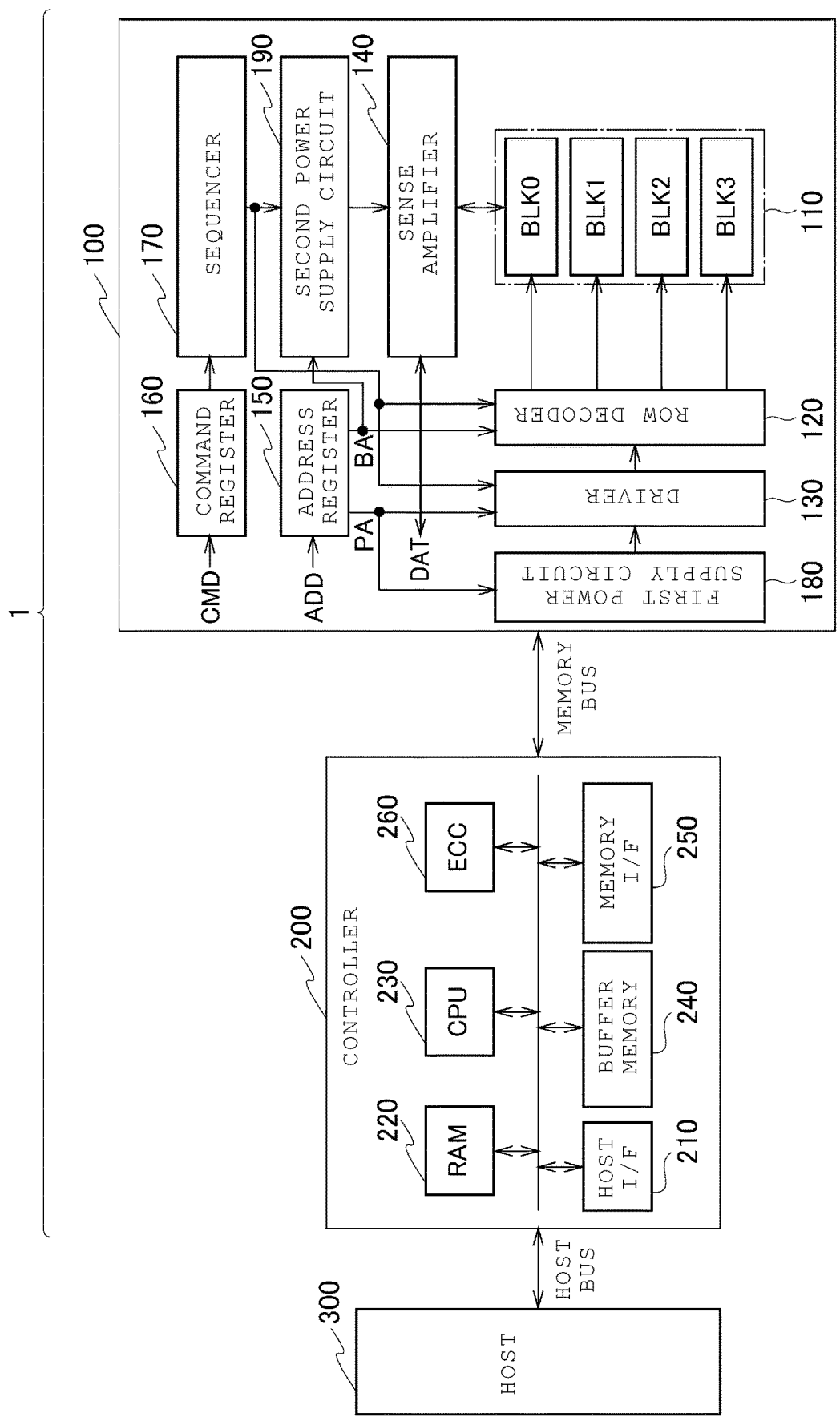
FIG. 1 is a block configuration diagram of a memory system including a variable resistance nonvolatile memory according to a first embodiment.

Embodiments provide a variable resistance nonvolatile memory that can operate at a peak temperature regardless of the position of the word line of a selected memory cell.

In general, according to one embodiment, a variable resistance nonvolatile memory includes a first memory cell and a second memory cell. The first memory cell includes a variable resistance layer that extends in a first direction orthogonal to a semiconductor substrate, a semiconductor layer that extends in the first direction and is in contact with the variable resistance layer, an insulator layer that extends in the first direction and is in contact with the semiconductor layer, and a first voltage applying electrode that extends in a second direction orthogonal to the first direction and is in contact with the insulator layer. The second memory cell includes a second voltage applying electrode that is above the first voltage applying electrode, extends in the second direction, and is in contact with the insulator layer. When a write operation is performed on the first memory cell, a first voltage is applied to the second voltage applying electrode, and when a write operation is performed on the second memory cell, a second voltage that is lower than the first voltage, is applied to the first voltage applying electrode.

First Embodiment

Hereinafter, embodiments are described with reference to the drawings. In the following description, components having the same function and configuration are designated by a common reference numeral.

(Memory System)

First, a block configuration of a memory system 1 including a variable resistance nonvolatile memory according to a first embodiment is described with reference to FIG. 1. The memory system 1 illustrated in FIG. 1 includes a memory chip 100 and a controller 200. For example, the memory chip 100 and the controller 200 may be integrated as one semiconductor device, and examples thereof include a memory card or an SSD.

The memory chip 100 includes a plurality of memory cells and stores data in a non-volatile manner. The controller 200 is connected to the memory chip 100 by a memory bus and is connected to a host 300 by a host bus. Also, the controller 200 controls the memory chip 100 and responds to a host command received from the host 300 to access the memory chip 100. The host 300 is, for example, a digital camera or a personal computer, and the host bus is, for example, a bus that conforms to a memory interface standard. The memory bus transmits and receives a signal according to a memory interface standard.

(Configuration of Controller 200)

Subsequently, details of the configuration of the controller 200 are described with reference to FIG. 1. As illustrated in FIG. 1, the controller 200 includes a host interface circuit (host I/F) 210, a built-in memory (Random Access Memory: RAM) 220, a processor (Central Processing Unit: CPU) 230, a buffer memory 240, a memory interface circuit (memory I/F) 250, and an error checking and correcting (ECC) circuit 260.

The host interface circuit 210 is connected to the host 300 via a host bus and transmits a host command and data received from the host 300 to the processor 230 and the buffer memory 240, respectively. The host interface circuit 210 responds to the instruction of the processor 230 and transmits data in the buffer memory 240 to the host 300.

The processor 230 controls operations of the entire controller 200. For example, when a host command relating to reading is received from the host 300, the processor 230 responds to the host command and causes the memory interface circuit 250 to issue a read command (memory command) to the memory chip 100. Also when a host command relating to writing is received from the host 300, the processor 230 responds to the host command and causes the memory interface circuit 250 to issue a write command (memory command) to the memory chip 100. The processor 230 also performs various processes (such as wear leveling) for managing the memory chip 100.

The memory interface circuit 250 is connected to the memory chip 100 via a memory bus and manages communication with the memory chip 100. Also, the memory interface circuit 250 transmits various signals to the memory chip 100 and receives various signals from the memory chip 100 based on the instruction received from the processor 230.

The buffer memory 240 temporarily stores write data for the memory chip 100 and read data from the memory chip 100.

The built-in memory 220 is, for example, a semiconductor memory such as DRAM or SRAM and is used as a work area of the processor 230. Also, the built-in memory 220 stores firmware for managing the memory chip 100, and various management tables such as a shift table, a history table, and a flag table, described below.

The ECC circuit 260 performs error detection and error correction processes relating to the data stored in the memory chip 100. That is, the ECC circuit 260 generates an error correction code when writing data, places the error correction code in the write data, and decodes the error correction code when reading the data.

(Configuration of Memory Chip 100)

Subsequently, the configuration of the memory chip 100 is described. The memory chip 100 illustrated in FIG. 1 includes a memory cell array 110, a row decoder 120, a driver circuit 130, a sense amplifier 140, an address register 150, a command register 160, a sequencer 170, a first power supply circuit 180, and a second power supply circuit 190.

The memory cell array 110 includes a plurality of blocks BLK including a plurality of nonvolatile memory cells associated with rows (word lines) and columns (bit lines). In FIG. 1, for example, four blocks BLK0 to BLK3 are illustrated. Also, the memory cell array 110 stores data received from the controller 200.

The row decoder 120 selects any one of the blocks BLK0 to BLK3 based on a block address BA in the address register 150 and also selects a word line direction for the selected block BLK.

The driver circuit 130 supplies a voltage via the row decoder 120 with respect to the selected block BLK based on the page address PA in the address register 150. The driver circuit 130 includes, for example, a source line driver.

The sense amplifier 140 includes a sense amplifier module SA for each bit line BL, and senses data read from the memory cell array 110 in the case of reading the data and performs required calculation. Also, this data DAT is output to the controller 200. In the case of writing the data, the write data DAT received from the controller 200 is transmitted to the memory cell array 110.

The address register 150 stores an address ADD received from the controller 200. In this address ADD, the block address BA and the page address PA are provided. The command register 160 stores a command CMD received from the controller 200.

The sequencer 170 controls operations of the entire memory chip 100 based on the command CMD stored in the command register 160. The first power supply circuit 180 is a circuit that supplies a power supply voltage to the driver circuit 130. The second power supply circuit 190 is a circuit that supplies the power supply voltage to the sense amplifier 140. The first power supply circuit 180 and the second power supply circuit 190 are further described below with reference to a circuit configuration of the variable resistance nonvolatile memory according to the first embodiment (see FIG. 21).

(Circuit Configuration of Memory Cell Array 110)

Subsequently, the equivalent circuit configuration of the memory cell array 110 is described with reference to FIG. 2.

Figure 2:
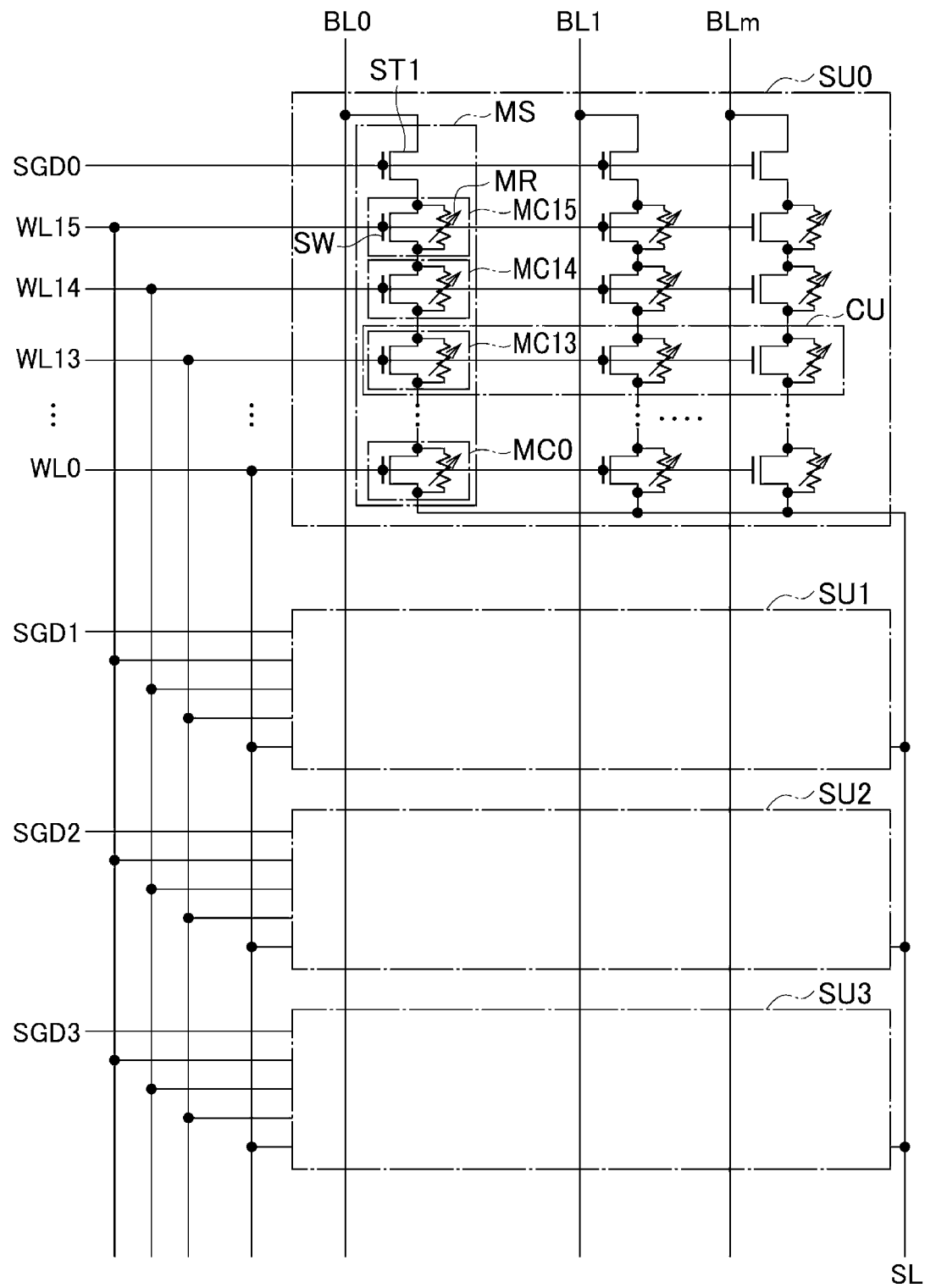
FIG. 2 is a diagram illustrating an equivalent circuit configuration of the memory cell array of FIG. 1.

As illustrated in FIG. 2, the block BLK of the memory cell array 110 includes, for example, four string units SU (SU0 to SU3). Any number of the string units SU may be provided in the block BLK. Each of the string units SU includes a plurality of memory cell strings MS.

Each of the memory cell strings MS includes, for example, 16 memory cells MC (MC0 to MC15) and a select transistor ST1. Hereinafter, when the description is not limited to one of the memory cells MC0 to MC15, the memory cells MC0 to MC15 are denoted as the memory cells MC. Further, one or any number of the select transistors ST1 may be provided in each of the memory cell strings MS.

The memory cell MC includes a storage element (more specifically, a variable resistance storage area, a variable resistance layer, or a variable resistance element) MR, and a selector SW. Examples of the storage element MR include an alloy-type phase transition element (GST: $Ge_2Sb_2Te_5$). The storage element MR according to the first embodiment enters a state of low resistance or high resistance according to the change in its crystal state. Hereinafter, the change in the crystal state of the storage element MR is referred to as a "phase change", a case where the storage element MR enters a low resistance state (LRS) is referred to as a "set state", and a case where the storage element MR enters a high resistance state (HRS) is referred to as a "reset state". For example, when the crystal state changes to an amorphous state, the storage element MR enters a high resistance state. When the crystal state changes to a crystalized state, the storage element MR enters a low resistance state. When the selected memory cell MC is in a high resistance state (reset), the voltage of the bit line BL slowly decreases. When the selected memory cell MC is in a low resistance state (set), the voltage of the bit line BL rapidly decreases. In addition, according to the first embodiment, the selector SW is, for example, a transistor, and includes a semiconductor layer, a gate insulating film, and a gate electrode. In the memory cell MC, the storage element MR and the selector SW are connected in parallel. The number of memory cells MC provided in each of the memory cell strings MS may be 8, 32, 48, 64, 96, or 128, and is not limited to any particular number.

(When Memory Cell MC is not Selected)

Figure 3:
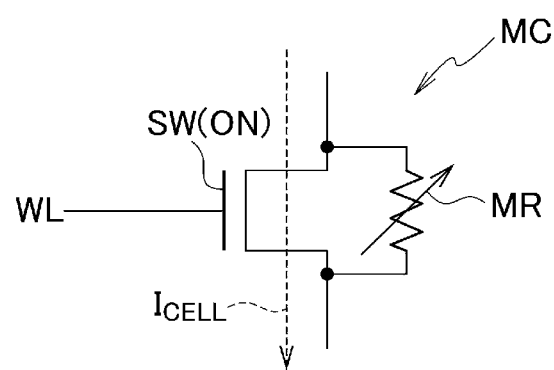
FIG. 3 is a diagram illustrating a path of a current that flows in a memory cell when a selector is in an on state in the variable resistance nonvolatile memory according to the first embodiment.

When the memory cell MC is not selected, the selector SW enters an on state (conductive state). FIG. 3 is a circuit diagram illustrating a path of a current that flows in the memory cell when the selector SW is in an on state, in the variable resistance nonvolatile memory according to the first embodiment.

As illustrated in FIG. 3, when the selector SW is in an on state, an inversion layer is formed on the semiconductor layer of the selector SW, and thus the current flows through the inversion layer. The resistance value of the storage element MR in the low resistance state is higher than the resistance value of the semiconductor layer in the on state of the selector SW by 10 times or more. Therefore, the current does not flow in the storage element MR connected in parallel. A unit that stores data in the memory cell MC is the storage element MR. Therefore, the expression "a current does not flow in the storage element MR" means that the memory cell is not selected.

(When Memory Cell MC is Selected)

Figure 4:
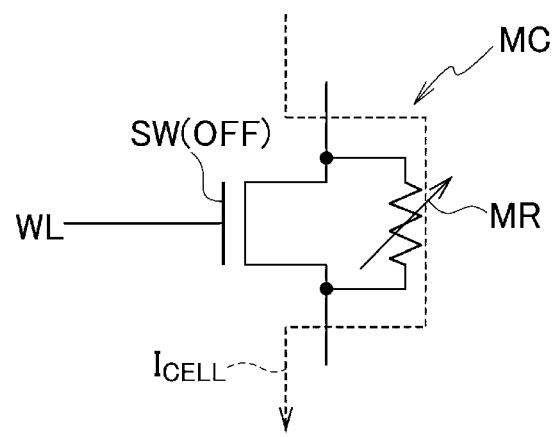
FIG. 4 is a diagram illustrating a path of a current that flows in a memory cell when a selector is in an off state in the variable resistance nonvolatile memory according to the first embodiment.

When the memory cell MC is selected, the selector SW enters an off state (non-conductive state). FIG. 4 is a circuit diagram illustrating a path of a current that flows in the memory cell when the selector SW is in an off state in the variable resistance nonvolatile memory according to the first embodiment.

As illustrated in FIG. 4, when the selector SW is in an off state, an inversion layer is not formed on the semiconductor layer of the selector SW. The resistance value of the storage element MR in the high resistance state is lower than the resistance value of the semiconductor layer in the off state of the selector SW by 10 times or more. Therefore, the current barely flows through the semiconductor layer of the selector SW, and the current mainly flows through the storage element MR.

Referring back to FIG. 2, the memory cell array 110 is continuously described. The memory cells MC0 to MC15 respectively provided in the memory cell strings MS are connected between the select transistor ST1 and a source line SL in series. The control gates (a plurality of control gates) of the memory cells MC0 of the respective memory cell strings MS provided in the same block BLK are commonly connected to a word line WL0. In the same manner, the control gates of the memory cells MC0 to MC15 of the plurality of memory cell strings MS provided in the same block BLK are commonly connected to the word lines WL0 to WL15, respectively. Hereinafter, when the description is not limited to one of the word lines WL0 to WL15, the word lines WL0 to WL15 are denoted as the word lines WL.

In the following description, the plurality of memory cells MC respectively connected to the common word lines WL in the string units SU are referred to as memory cell units (CU). Also, a set of 1-bit data stored in the memory cell unit is referred to as a "page". Accordingly, when 2-bit data is stored in one memory cell MC, the memory cell unit stores data for two pages.

The gates of the plurality of select transistors ST1 in the string unit SU are commonly connected to the select gate line SGD. Specifically, the gates of the plurality of select transistors ST1 in the string unit SU0 are commonly connected to the select gate line SGD0. In the same manner, the gates of the plurality of select transistors ST1 in the string unit SU1 are commonly connected to the select gate line SGD1. The same description applies to the string units SU2 and SU3. Hereinafter, when the description is not limited to one of the select gate lines SGD (SGD0, SGD1, and the like), the select gate lines SGD (SGD0, SGD1, and the like) are denoted as the select gate lines SGD. Each of the select gate lines SGD and the word lines WL is independently controlled by the row decoder 120.

The drains of the select transistors ST1 of the memory cell strings MS in the same column in the memory cell array 110 are commonly connected to the bit lines BL (BL0 to BLm) (where, m is a natural number of 1 or more). That is, the bit lines BL are commonly connected to the memory cell strings MS across the plurality of blocks BLK. Further, the sources of the plurality of memory cells MC0 are commonly connected to the source line SL.

That is, the string unit SU includes the plurality of memory cell strings MS that are connected to the different bit lines BL and connected to the same select gate line SGD. The block BLK includes the plurality of string units SU that share the word lines WL. Also, the memory cell array 110 includes the plurality of blocks BLK that share the bit lines BL.

(Structure of Memory Cell)

Figure 5:
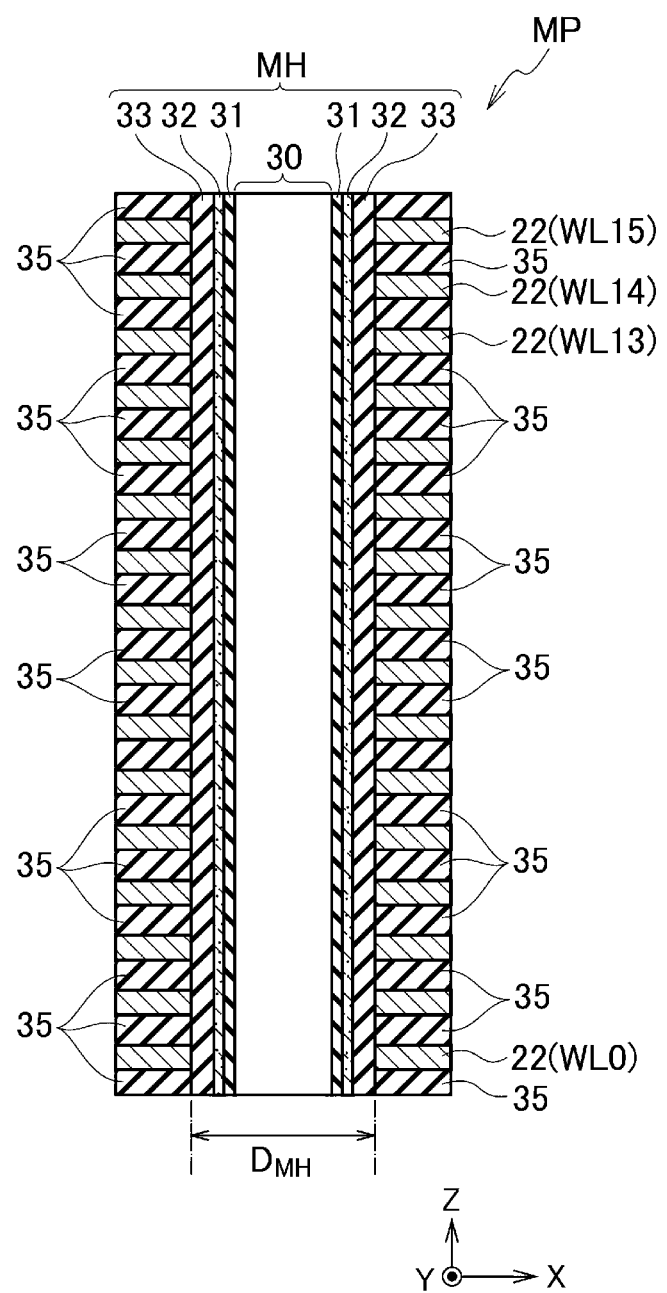
FIG. 5 is a cross-sectional view of a memory pillar of the variable resistance nonvolatile memory according to the first embodiment.

An example of a cross-sectional structure of a memory pillar MP of the variable resistance nonvolatile memory according to the first embodiment is described. FIG. 5 is an example of the cross-sectional structure of the memory pillar MP that is three-dimensionally stacked in the variable resistance nonvolatile memory according to the first embodiment. As illustrated in FIG. 5, the memory pillar MP includes, for example, conductor layers 22.

Insulator layers 35 and the conductor layers (voltage applying electrodes) 22 are alternately stacked. The conductor layers 22 are formed in a plate shape expanding, for example, along an X-Y plane. For example, the plurality of stacked conductor layers 22 are used as the word lines WL15 to WL0, respectively. The conductor layer 22 includes, for example, tungsten (W).

The memory pillar MP has a columnar shape extending along a Z direction and penetrates the conductor layers 22. The memory pillar MP includes, for example, a core portion 30, a variable resistance layer 31, a semiconductor layer 32, and an insulator layer 33. Specifically, a memory hole MH that penetrates the stacked structure of the conductor layers 22 and the insulator layers 35 is provided. The memory hole MH is a cylindrical shape extending, for example, in the Z direction. The memory pillar MP includes the insulator layer 33, the semiconductor layer 32, the variable resistance layer 31, and the core portion 30, which are stacked sequentially in that order in the memory hole MH (inner wall). Specifically, the memory pillar MP includes the cylindrical insulator layer 33 that covers the inner wall of the memory hole MH and extends in the Z direction, the cylindrical semiconductor layer 32 that covers the inner wall of the insulator layer 33 and extends in the Z direction, and the cylindrical variable resistance layer 31 that covers the inner wall of the semiconductor layer 32 and extends in the Z direction. A diameter $D_{MH}$ of the memory hole MH is as illustrated in FIG. 5.

The core portion 30 has a columnar shape extending, for example, in the Z direction. $SiO_2$ or a material having a higher heat resistance than $SiO_2$ may be employed as the core portion 30. Further, vacuum or inert gas may be employed as the core portion 30.

The degree of vacuum when the core portion 30 is removed to form a vacuum region, is in the ranges of $10^5$ Pa to $10^2$ Pa in a low vacuum, $10^2$ Pa to $10^{-1}$ Pa in a medium vacuum, $10^{-1}$ Pa to $10^{-5}$ Pa in a high vacuum, and $10^{-5}$ Pa to $10^{-8}$ Pa in an ultra high vacuum. When the core portion 30 is filled with an inert gas, for example, a rare gas such as helium, neon, argon, krypton, xenon, radon, or oganesson, or a nitrogen gas may be used.

The variable resistance layer 31 covers the side surface (outer circumference) of the core portion 30 (in contact with the core portion 30). The variable resistance layer 31 extends, for example, in the Z direction and is provided with a cylindrical shape. The heat generation temperature on the variable resistance layer 31 of the memory element can be increased by employing a material having a higher heat resistance than $SiO_2$, a vacuum, or an inert gas in the core portion 30.

The semiconductor layer 32 in the memory pillar MP covers the side surface (outer circumference) of the variable resistance layer 31 (in contact with the variable resistance layer 31). The semiconductor layer 32 in the memory pillar MP extends, for example, in the Z direction and is provided with a cylindrical shape. The thickness of the variable resistance layer 31 is, for example, 20 nm or less. The diameter of the core portion 30 is larger than the thickness of the variable resistance layer 31 and is, for example, several tens of nanometers or more.

When the memory cell MC is selected, the cell current flows through a thin area of the variable resistance layer 31 that is in contact with the semiconductor layer 32. Therefore, the thickness of the variable resistance layer 31 is sufficiently thinner than the diameter of the core portion 30. The current density flowing through the variable resistance layer 31 can be set to be high by causing the thickness of the variable resistance layer 31 to be sufficiently thinner than the diameter of the core portion 30. As a result, the heat generation temperature in the memory element can be increased to improve the localization of the heat generation portion so that the disturbance to the adjacent memory cell (which may cause possible data destruction in the adjacent memory cell) can be reduced.

The insulator layer 33 covers the side surface of the semiconductor layer 32. The insulator layer 33 includes a portion provided, for example, in a cylindrical shape. The insulator layer 33 includes, for example, an insulator such as silicon oxide ($SiO_2$). The conductor layer 22 covers a portion of the side surface of the insulator layer 33 (in contact with the insulator layer 33) in the memory pillar MP.

(Structure of Memory Cell Array 110)

Hereinafter, an example of the cross-sectional structure of the memory cell array 110 in the variable resistance non-volatile memory according to the first embodiment is described. Further, in the drawing referred to below, an X direction corresponds to an extension direction of the bit line BL, a Y direction corresponds to an extension direction of the word line WL, and the Z direction corresponds to a direction vertical to an upper surface of a semiconductor substrate 20 on which the memory cell array 110 is formed.

Figure 6:
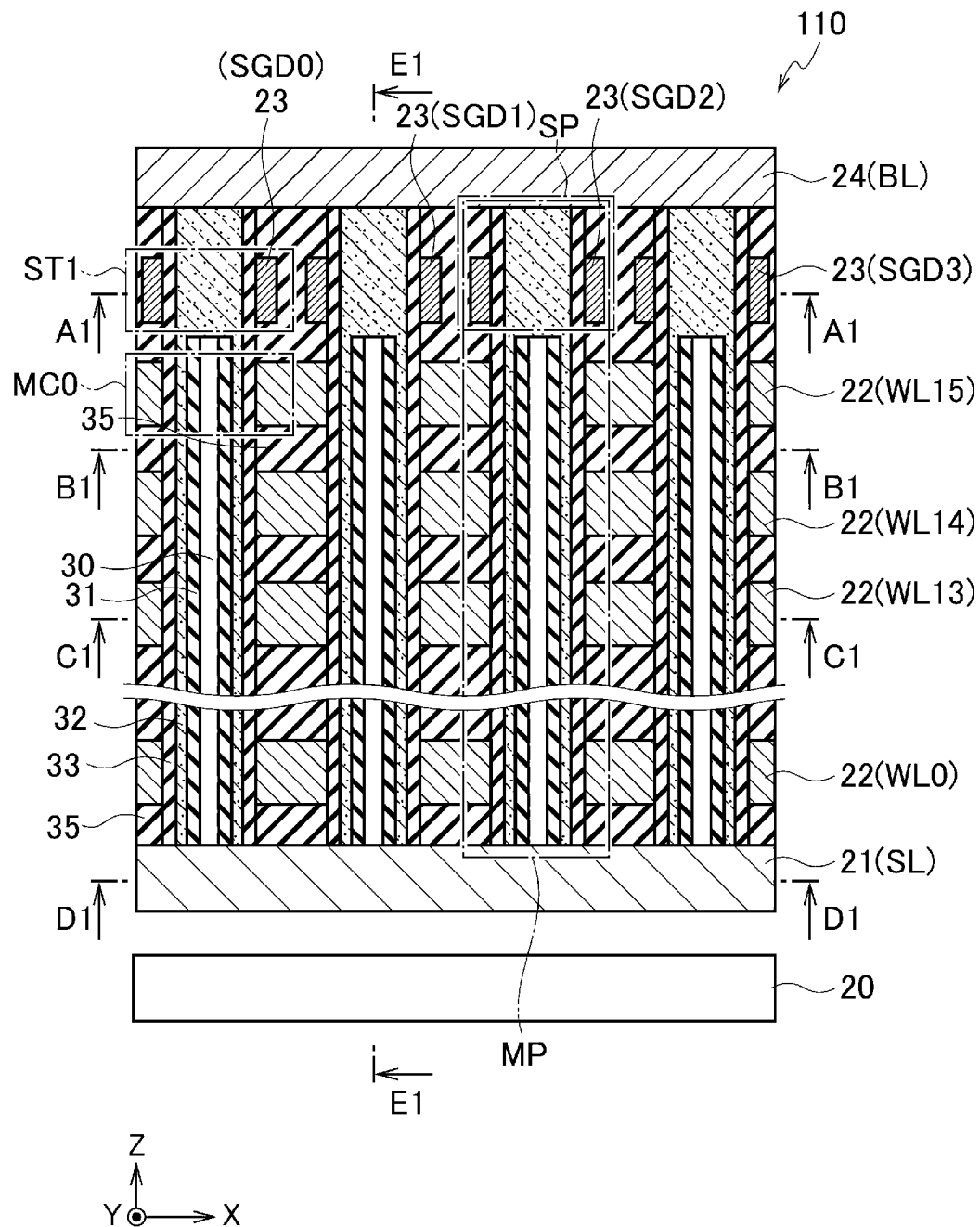
FIG. 6 is a cross-sectional view of the memory cell array of the variable resistance nonvolatile memory according to the first embodiment.

FIG. 6 illustrates an example of the cross-sectional structure of the memory cell array 110 in the variable resistance nonvolatile memory according to the first embodiment. As illustrated in FIG. 6, the memory cell array 110 includes, for example, conductor layers 21 to 24. The conductor layers 21 to 24 are provided over the semiconductor substrate 20.

Specifically, a conductor layer (voltage applying electrode) 21 is provided over the semiconductor substrate 20 in the Z direction via an insulator layer. For example, a circuit such as the sense amplifier 140 may be provided, for example, on the insulator layer between the semiconductor substrate 20 and the conductor layer 21. The conductor layer 21 is formed in a plate shape expanding, for example, along the X-Y plane and is used as the source line SL. The conductor layer 21 includes, for example, silicon (Si).

The insulator layers 35 and the conductor layers (voltage applying electrodes) 22 are alternately stacked over the conductor layer 21 in the Z direction. The conductor layers 22 are formed in a plate shape expanding, for example, along the X-Y plane. For example, the plurality of conductor layers 22, which are used as the word lines WLn to WL0, respectively, are stacked in order from the semiconductor substrate 20 side. The conductor layer 22 includes tungsten (W).

For example, the conductor layers (voltage applying electrodes) 23 are stacked over the conductor layers 22 (WL15) over the uppermost layer in the Z direction via an insulator layer. The conductor layer 23 extends in the Y direction and is divided for each select pillar SP described below, in the X direction. The divided conductor layers 23 are used as the select gate lines SGD0 to SGD3, respectively. The conductor layer 23 includes, for example, tungsten W.

The conductor layers (voltage applying electrode) 24 are provided over the conductor layer 23 in the Z direction. For example, the conductor layer 24 is formed in a line shape extending along the X direction and used as the bit line BL. The conductor layer 24 includes, for example, copper (Cu).

The columnar select pillar SP penetrating the conductor layer 23 is provided on the memory pillar MP. In addition, the select pillar SP includes, for example, the semiconductor layer 32 and the insulator layer 33. Specifically, the select pillar SP penetrates the conductor layer 23, is provided with an SGD hole SH of which the bottom portions reach the memory pillar MP, and sequentially provided with the insulator layer 33 and the semiconductor layer 32 in the SGD hole SH. In addition, the layer including the boundary between the memory hole MH and the SGD hole SH is provided in the layer between the uppermost conductor layer 22 and the conductor layer 23.

The bottom portions of the core portion 30, the variable resistance layer 31, the semiconductor layer 32, and the insulator layer 33 of the memory pillar MP are in contact with the conductor layer 21. The semiconductor layer 32 in the select pillar SP is, for example, a columnar shape. The base of the semiconductor layer 32 of the select pillar SP is in contact with the semiconductor layer 32, the variable resistance layer 31, and the core portion 30 of the memory pillar MP. The conductor layer 23 covers a portion of the side surface of the insulator layer 33 in the select pillar SP (is in contact with the insulator layer 33).

Figure 7:
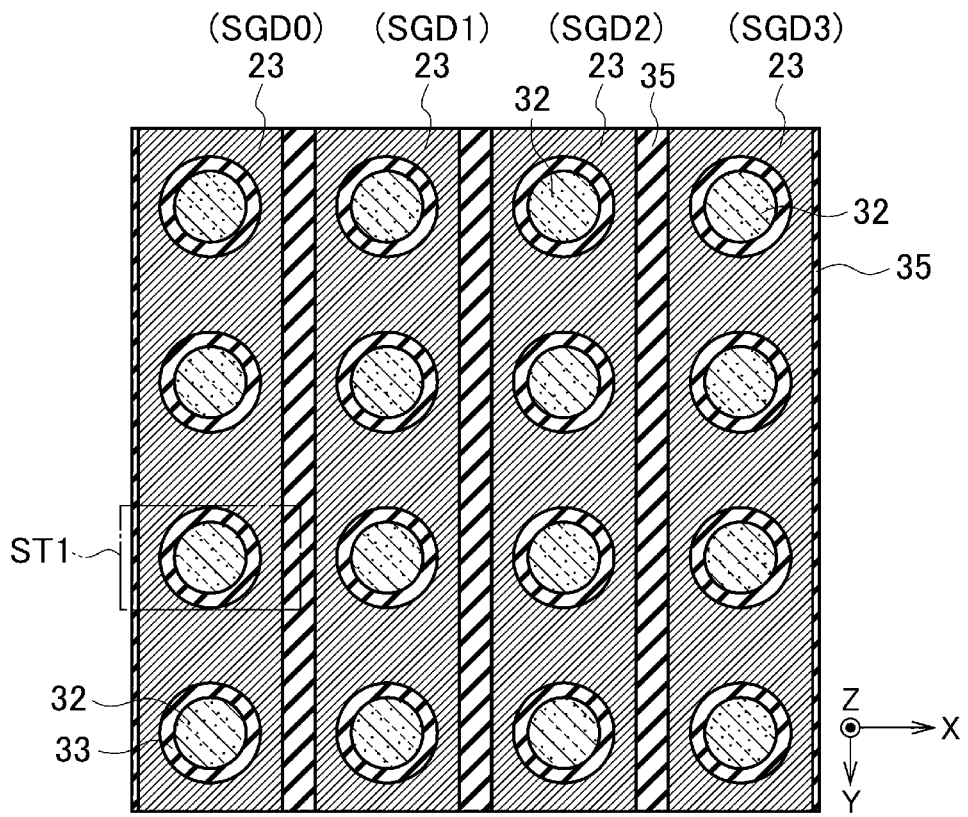
FIG. 7 illustrates a cross-section taken along line A1-A1 in FIG. 6.

Subsequently, the plane pattern configuration of the conductor layer 23 is described with reference to FIG. 7. FIG. 7 illustrates a cross-section taken along line A1-A1 in FIG. 6. As illustrated in FIG. 7, the insulator layer 33 and the semiconductor layer 32 are provided in the SGD hole SH that penetrates the conductor layer 23. Also, the conductor layer 23 functions as the select gate lines SGD0 to SGD3 of the select transistor ST1, and the insulator layer 33 functions as the gate insulating film of the select transistor ST1, and the semiconductor layer 32 functions as the semiconductor layer of the select transistor ST1. The memory pillar MP can be selected for each one word line by using this select transistor ST1. By causing the select transistor ST1 to go into an on state, an inversion layer is formed on the semiconductor layer 32 that is in contact with the variable resistance layer 31 of the memory pillar MP, and the memory pillar MP can be selected by flowing the current via the inversion layer.

Figure 8:
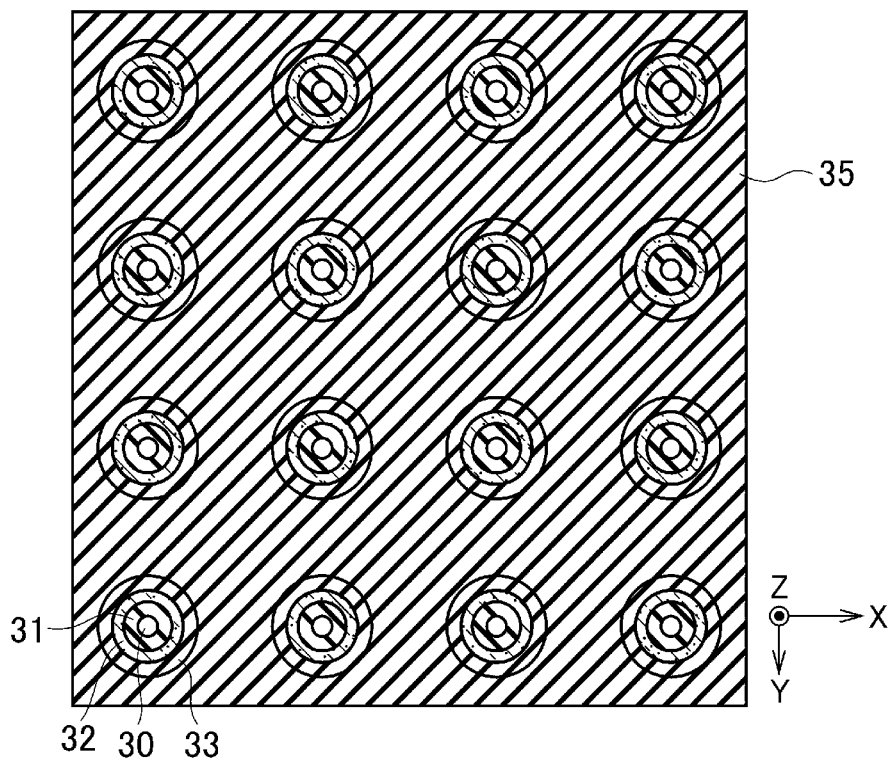
FIG. 8 illustrates a cross-section taken along line B1-B1 in FIG. 6.

Subsequently, the plane pattern configuration among the memory cells MC in the Z direction is described with reference to FIG. 8. FIG. 8 illustrates a cross-section taken along line B1-B1 in FIG. 6. The core portion 30, the variable resistance layer 31, the semiconductor layer 32, and the insulator layer 33 illustrated in FIG. 8 form parts of the memory cells MC in the Z direction, and the current flows in the semiconductor layer 32.

Figure 9:
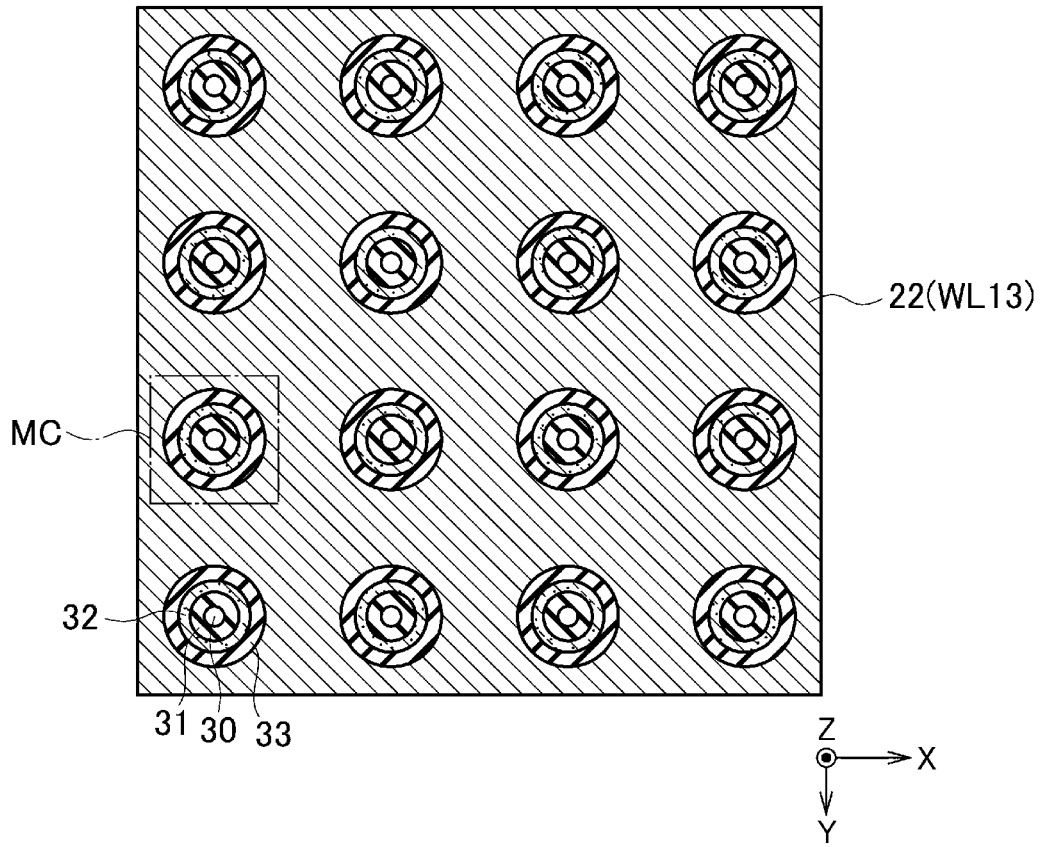
FIG. 9 illustrates a cross-section taken along line C1-C1 in FIG. 6.
Figure 10:
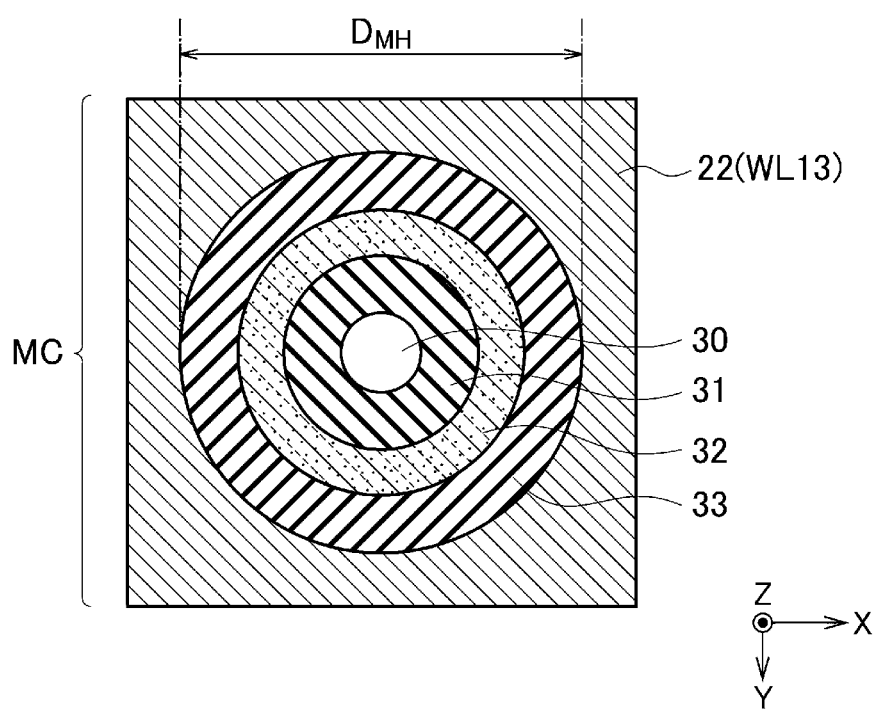
FIG. 10 is a plan view of one memory cell of the variable resistance nonvolatile memory according to the first embodiment.

Subsequently, the plane pattern configuration of the conductor layer 22 is described with reference to FIGS. 9 and 10. FIG. 9 illustrates a cross-section taken along line C1-C1 in FIG. 6. FIG. 10 is a plan view of one memory cell MC. As illustrated in FIG. 10, the memory cell MC is provided at an intersection between the plate-shaped word line WL and the memory pillar MP. Specifically, as illustrated in FIG. 10, the insulator layer 33, the semiconductor layer 32, the variable resistance layer 31, and the core portion 30 are provided in the memory hole MH penetrating the conductor layer 22 and having the diameter $D_{MH}$. Also, the conductor layer 22 functions as the word line WL of the selector SW of the memory cell MC, the insulator layer 33 functions as a gate insulating film of the selector SW of the memory cell MC, and the semiconductor layer 32 functions as the semiconductor layer of the selector SW of the memory cell MC. The variable resistance layer 31 functions as the storage element MR of the memory cell MC.

Figure 11:
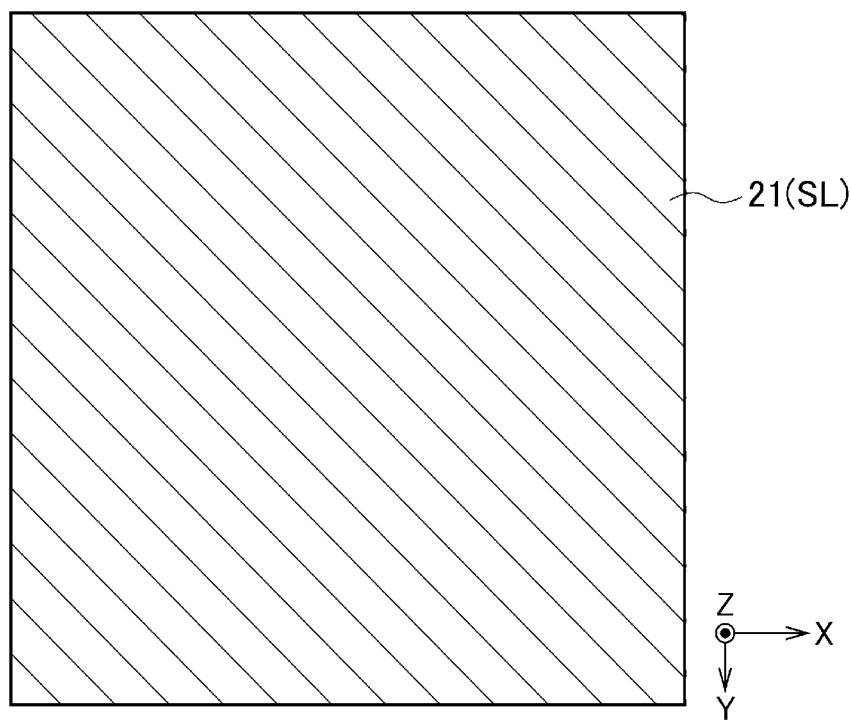
FIG. 11 illustrates a cross-section taken along line D1-D1 in FIG. 6.

Subsequently, the plane pattern configuration of the conductor layer 21 is described with reference to FIG. 11. FIG. 11 illustrates a cross-section taken along line D1-D1 in FIG. 6. The conductor layer 21 has a plate shape and is set to be a constant low voltage so as to cause the current to flow from the bit line BL. The conductor layer 21 (source line) as illustrated in FIG. 11 has a plate shape like the conductor layer 22 (word line).

Figure 12:
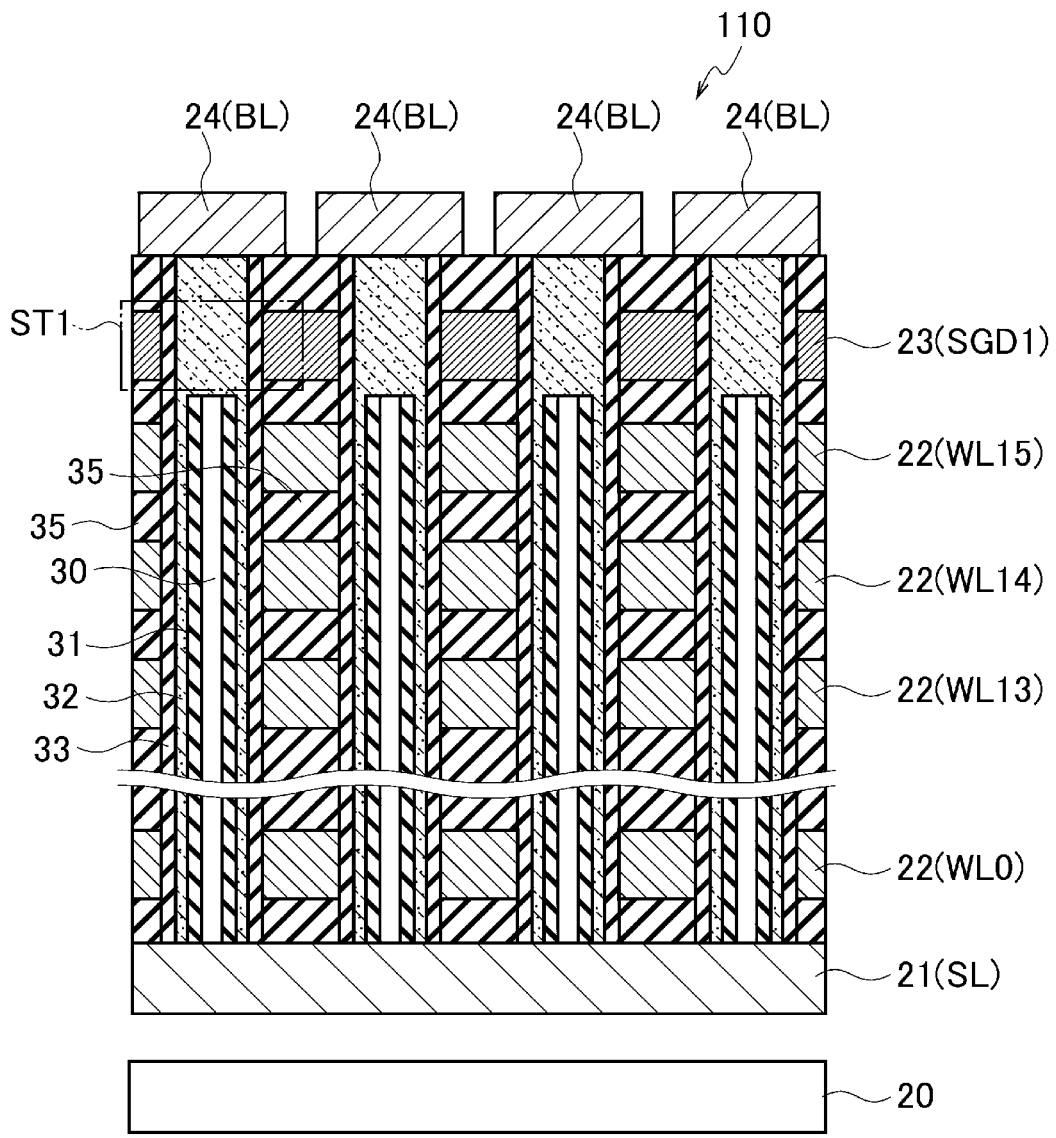
FIG. 12 illustrates a cross-section taken along line E1-E1 in FIG. 6.

Subsequently, an example of the cross-sectional structure of the memory cell array 110 is described with reference to FIG. 12. FIG. 12 illustrates a cross-section taken along line E1-E1 in FIG. 6. FIG. 12 is a cross section in a direction orthogonal to FIG. 6. With reference also to FIGS. 6 and 12, it is understood that the memory pillar MP has a concentric shape about the core portion 30.

(Outline of Operation)

Subsequently, in the variable resistance nonvolatile memory according to the first embodiment, an outline of the operation of the memory chip 100 is described. In the variable resistance nonvolatile memory according to the first embodiment, the read operation and the write operation of the memory chip 100 are performed by flowing the current between the bit line BL and the source line SL.

Figure 13:
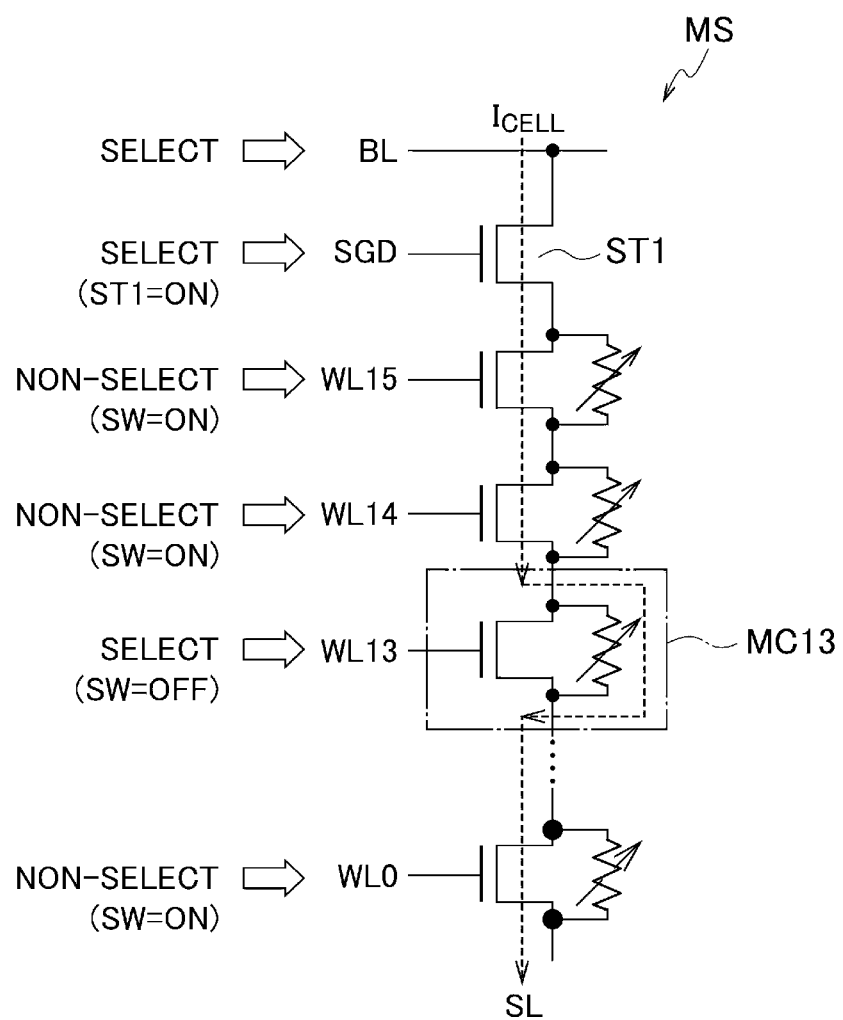
FIG. 13 is a circuit diagram of one memory cell string in the variable resistance nonvolatile memory according to the first embodiment.
Figure 14:
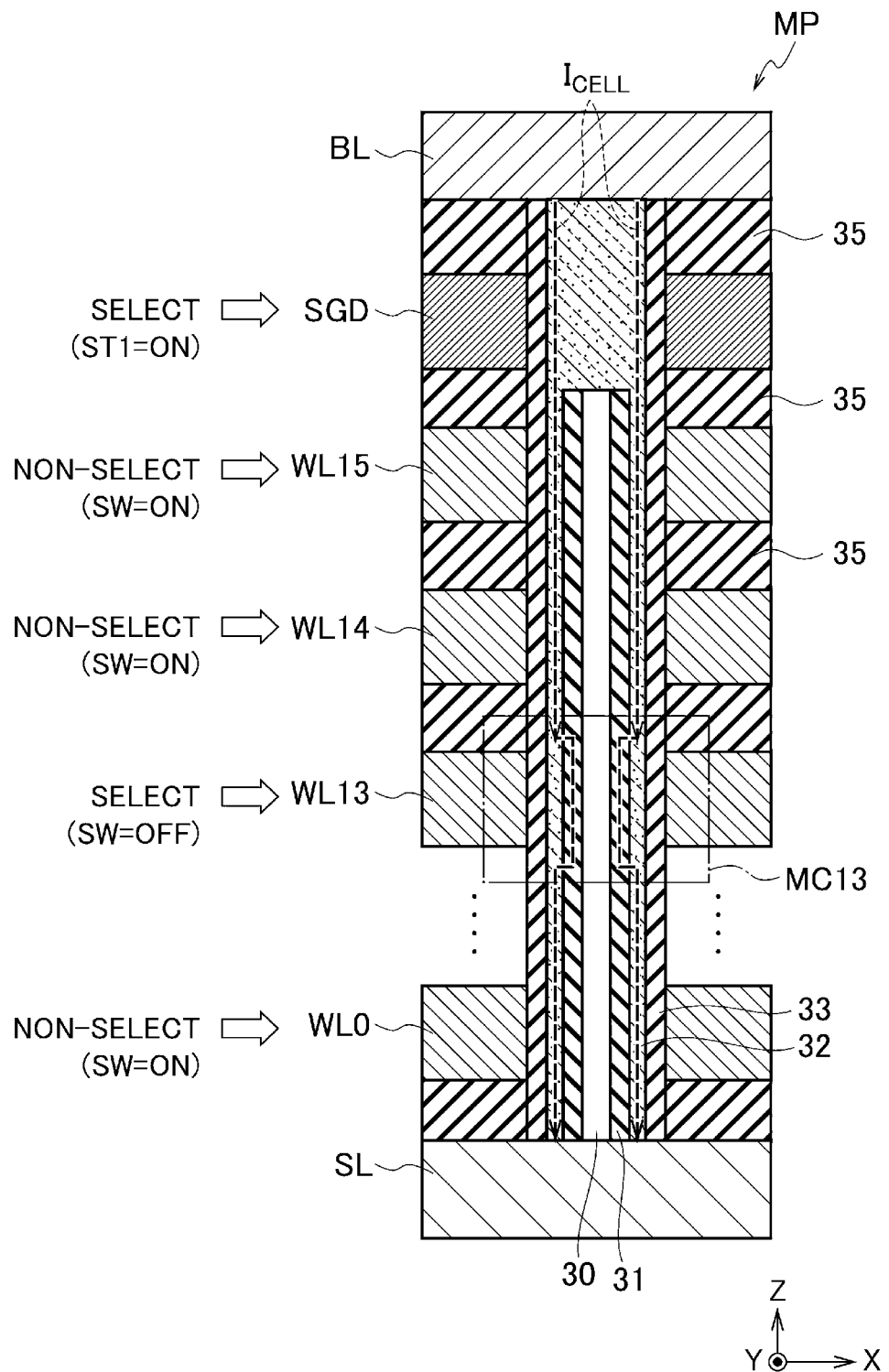
FIG. 14 is a cross-sectional view of one memory pillar corresponding to one memory cell string in the variable resistance nonvolatile memory according to the first embodiment.

A method of selecting the memory cell MC to perform the read operation or the write operation is schematically described with reference to FIGS. 13 and 14. FIG. 13 is a circuit diagram of one memory cell string MS. FIG. 14 is a cross-sectional view of the memory pillar MP corresponding to one memory cell string MS. As illustrated in FIGS. 13 and 14, a predetermined voltage (e.g., positive voltage) is applied to the select gate line SGD of the select transistor ST1 that is in contact with the memory pillar MP to which the memory cell MC (for example, MC13) desired to be selected belongs. Accordingly, the inversion layer is formed on the semiconductor layer of the select transistor ST1, and goes into a state in which the current can flow (on state). Accordingly, the bit line BL, the select transistor ST1, and the semiconductor layer of the memory pillar MP that is in contact with the select transistor ST1 are electrically connected. Further, the word line WL13 corresponding to the selected memory cell MC13 is set to, for example, 0 (V) or −2 (V), and a predetermined voltage (e.g., positive voltage) is applied to the word lines WL15, WL14, and WL12 to WL0 corresponding to the non-selected memory cell MC. Accordingly, the current path that flows between the bit lines BL and the source line SL flows through a variable resistance layer MR in the memory cell MC13 desired to be selected and flows through the semiconductor layers 32 of the selectors SW in the non-selected memory cells MC15, MC14, and MC12 to MC0. As illustrated in FIG. 14, since the core portion 30 is provided in the central portion of the memory pillar MP, the current in the selected memory cell MC flows through the variable resistance layer 31 that surrounds the core portion 30. In this manner, during both the read operation and the write operation, the variable resistance layer 31 can be selected. When the operation of the variable resistance nonvolatile memory according to the first embodiment is compared with that of a three-dimensional NAND-type flash memory, there is an advantage in that the operation can be performed with a lower voltage at a higher speed. In addition, there are fewer restrictions on the number of times of rewriting, and also the writing time can be shortened. Also, in variable resistance nonvolatile memory according to the first embodiment, unlike the three-dimensional NAND-type flash memory, there is no need for an erasing operation.

The write operation or the read operation is performed by causing the select transistor ST1 to go into an on state and flowing the current between the bit line BL and the source line SL. Therefore, it is not required to select all of the memory cell strings MS, and the selection can be performed for any bit line unit (column unit) connected to one select gate line.

When the memory cell strings MS that are not targets of the write operation or the read operation, are set so that the voltage of the source line=the voltage of the bit line, the write operation or the read operation is not performed. In addition, unlike the three-dimensional NAND-type flash memory, it is not required to perform the erasing operation in the unit of the block BLK, and the write operation for the setting or resetting can be performed in the unit of the select transistor ST1.

The word line WL selects any memory cell MC in a stacking direction (the Z direction). Therefore, the word line WL may be shared between the gate electrodes of the plurality of memory cells MC in the same X-Y plane. Also, the source line SL may be shared between the plurality of memory cell strings MS. Particularly, the source line SL may be shared between the plurality of memory cell strings MS adjacent to each other in the extension direction of the bit line BL.

For example, a plate shape in which the word line WL and the source line SL extend in the bit line direction and the word line direction is considered. The memory cell MC is selected only when the select transistor ST1 goes into an on state, and the current flows from the bit line BL to the source line SL. Therefore, even when the word line WL and the source line SL in the plate shape are selected, only the memory cell MC that is in contact with the word line WL selected directly under the selected select transistor ST1 and the selected bit lines BL is selected.

In the same manner as described above, the memory cell MC is selected by flowing the current via the bit line BL. Therefore, the sequencer 170 is configured to be capable of outputting a control signal as if the read operation and the write operation are simultaneously performed for each bit line.

The sequencer 170 can output the control signal as if reset writing and set writing are simultaneously performed for each bit line.

(Timing Chart of Operation Waveform)

Figure 15:
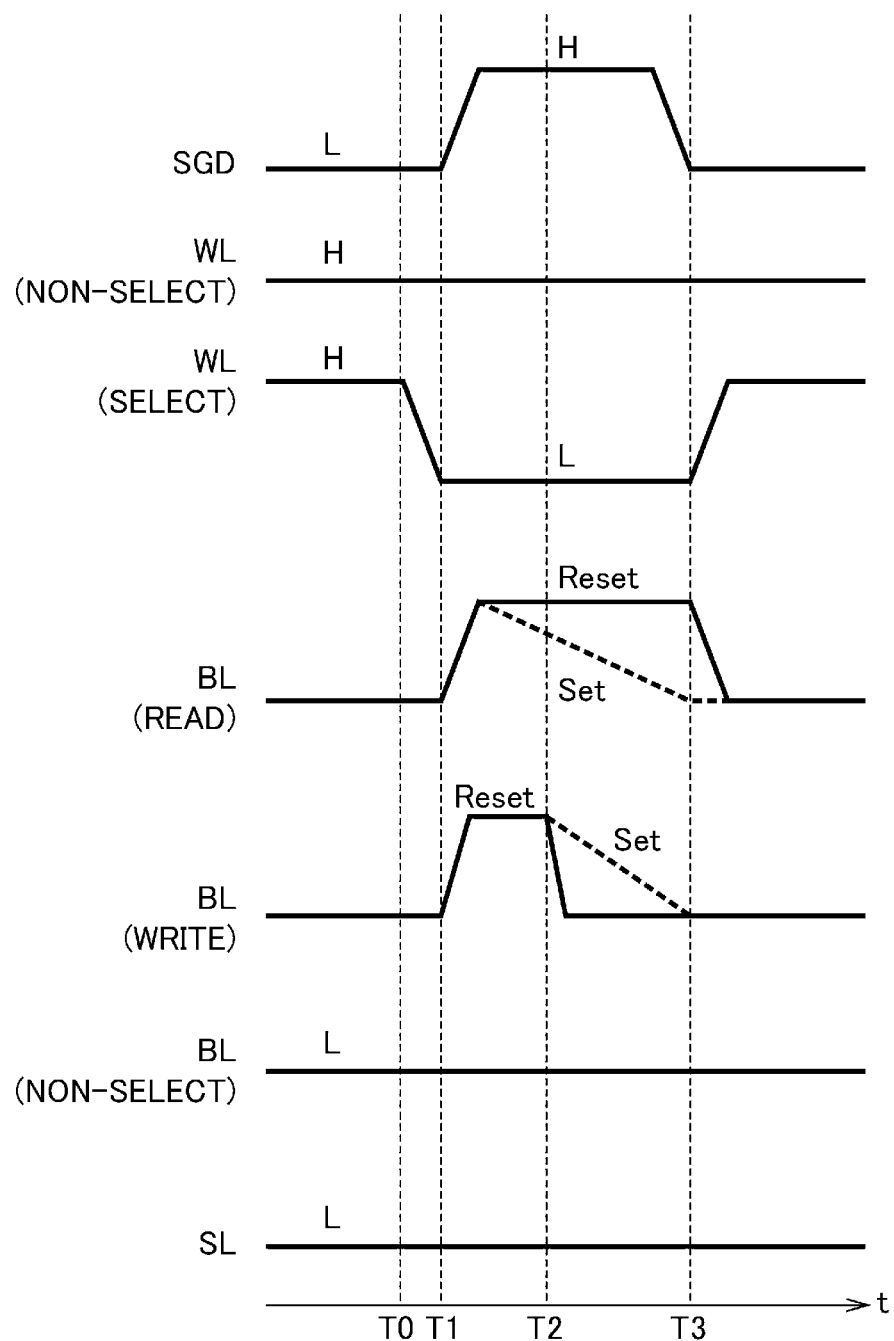
FIG. 15 is a timing chart of an operation waveform of the variable resistance nonvolatile memory according to the first embodiment.

FIG. 15 is a timing chart of an operation waveform of the variable resistance nonvolatile memory according to the first embodiment. As described above, in the memory chip 100 of the variable resistance nonvolatile memory according to the first embodiment, first, a voltage that causes the selector SW of the selected memory cell MC to enter an off state and causes the selector SW of the non-selected memory cells MC to enter an on state is applied to the word lines WL. Subsequently, the memory chip 100 applies a voltage that causes a select transistor corresponding to the selected memory cell MC to be turned on, to the select gate line SGD so that the bit line BL and the memory pillar MP to which the selected memory cell belongs enter a conductive state. In this manner, the current flows through the semiconductor layer of the selector SW in the non-selected memory cell and flows through the storage element MR in the selected memory cell.

Next, an operation waveform of the memory chip 100 of the variable resistance nonvolatile memory according to the first embodiment is described with reference to FIG. 15. First, a case of the read operation is described. The sequencer 170 maintains voltages of the non-selected bit lines BL and the source line in an L level and starts to decrease a voltage of the selected word line WL from an H level (L<H) at time T0, and maintains the voltage of the selected word line in an L level after time T1.

Subsequently, the sequencer 170 raises the voltage of the select gate line SGD of the select transistor ST corresponding to the selected memory cell MC from the L level to the H level. In addition, voltages of the non-selected word lines WL are maintained in the H level, and thus the selectors SW are maintained in an on state in the non-selected memory cells MC.

Also, the sequencer 170 causes the bit line BL to be in a floating state after raising the voltage of the bit line BL. Accordingly, when the selected memory cell MC is in a high resistance state (reset), the voltage of the bit line BL slowly decreases (the voltage is substantially maintained until the time T3), and when the selected memory cell MC is in a low resistance state (set), the voltage of the bit line BL rapidly decreases. The sense amplifier 140 senses the "H level/L level" of the voltage of the bit line BL after a certain period of time elapses from the application of the voltage to the bit line BL to perform the read operation.

Next, the case of the write operation is described. Operations at time T0 are the same as those in the read operation. In the write operation, the sequencer 170 applies a writing pulse (voltage) to the bit line BL at the time T1 and rapidly decreases the pulse at time T2, so that the reset state corresponding to a high resistance state is written. The sequencer 170 applies the writing pulse (voltage) to the bit line BL at the time T1 and slowly decreases the pulse at the time T2 so that the set state corresponding to a low resistance state is written. In addition, at this time, the non-selected bit line BL maintains the voltage of the source line SL to be the same (for example, the L level). The memory cell MC is selected by applying the voltage to the bit line BL connected to the memory cell MC. If the voltage of the non-selected bit line BL is raised, erroneous selection occurs, and thus erroneous writing occurs. The voltage is selectively applied to the bit line BL desired to be read and written.

(Relationship of Voltage Drops Across Non-Selected Memory Cells on Drain Side and Source Side of Selected Memory Cell)

Figure 16A:
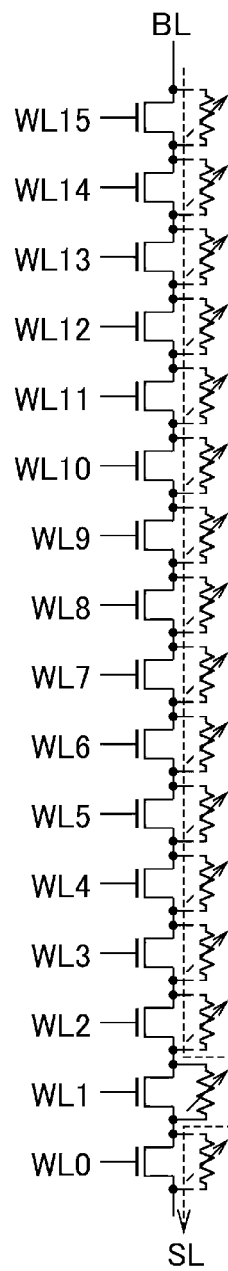
FIGS. 16A-16C are diagrams illustrating a current path through a memory cell string between a bit line and a source line, in the variable resistance nonvolatile memory according to the first embodiment.
Figure 16B:
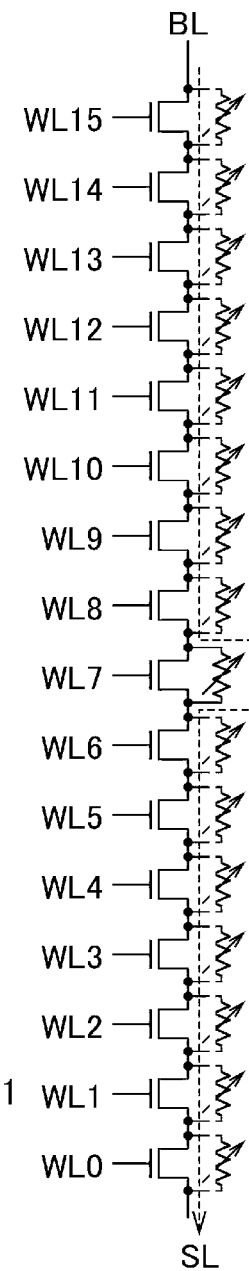
Figure 16C:
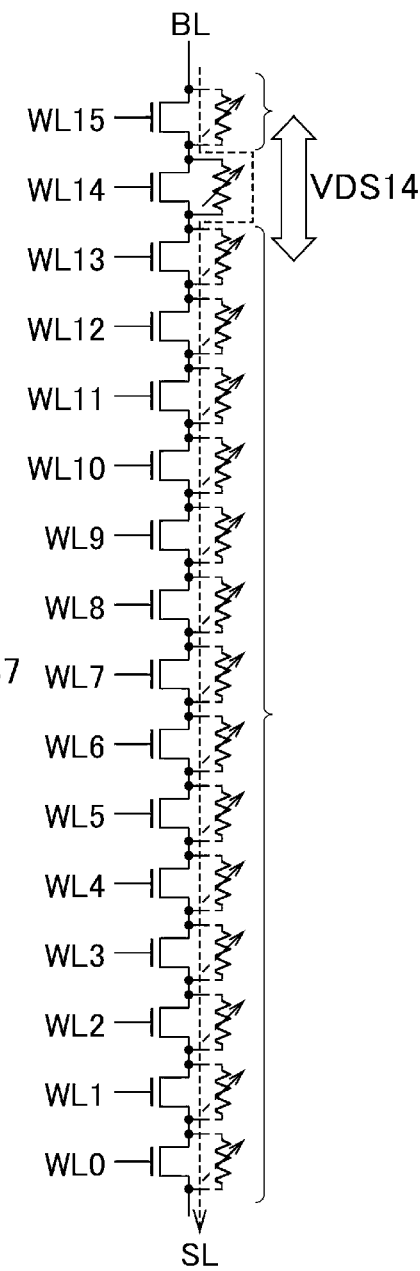

FIGS. 16A-16C illustrates a current that flows through the memory cells MC0 to MC15 in the memory cell string MS. The select transistor ST and the select gate lines SGD are not illustrated. In the variable resistance nonvolatile memory according to the first embodiment, when the memory cell MC1 connected to the word line WL1 is selected, the current that flows through the memory cell string MS between the bit line BL and the source line SL is illustrated with a broken line in FIG. 16A. When the memory cell MC7 connected to the word line WL7 is selected, the current that flows through the memory cell string MS between the bit line BL and the source line SL are illustrated with a broken line in FIG. 16B. In addition, when the memory cell MC14 connected to the word line WL14 is selected, the current that flows through the memory cell string MS between the bit line BL and the source line SL is illustrated with a broken line in FIG. 16C.

In the memory cell string MS, the voltage difference between the bit line BL and the source line SL is distributed among the memory cells MC0 to MC15. The selector SW (transistor) of the non-selected memory cell is turned on, but the selector SW (transistor) of the selected memory cell is turned off, and thus the resistance of the selected memory cell becomes higher than that of the non-selected memory cell. Accordingly, in the memory cell string MS, the voltage difference applied to the selected memory cell is larger than the voltage difference applied to the non-selected memory cells. As a result, in the memory cell string MS, the voltage at the portion on the drain side (the bit lines BL side) from the selected memory cell is higher than the voltage at the portion on the source side (source line SL side) from the selected memory cell. Accordingly, when it is assumed that the voltage applied to the non-selected word lines WL is constant, the selector SW (ON) of the non-selected memory cell positioned on the drain side of the selector SW (OFF) of the selected memory cell has a smaller gate-source voltage Vgs, and the selector SW (ON) of the non-selected memory cell positioned on the source side has a larger gate-source voltage Vgs. Generally, in the transistor, the ON current increases as the gate-source voltage Vgs increases (an on-state resistance Ron decreases), and the ON current decreases as the gate-source voltage Vgs decreases (the on-state resistance Ron increases). Therefore, the voltage applied to each memory cell increases in the selector SW (ON) of the non-selected memory cell positioned on the drain side of the selector SW (OFF) of the selected memory cell, and the voltage applied to each memory cell decreases in the selector SW (ON) of the non-selected memory cell positioned on the source side of the selector SW (OFF) of the selected memory cell.

In the example of FIG. 16A, in the selector SW (ON) of the non-selected memory cell on the drain side of the selector SW (OFF) of the memory cell MC1 connected to the word line WL1, Vgs is small, and the on-state resistance Ron is large. In the selector SW (ON) of the non-selected memory cell on the source side of the selector SW (OFF) of the memory cell MC1, Vgs is large, and the on-state resistance Ron is small. That is, in the selector SW (ON) of the non-selected memory cell on the drain side of the selector SW (OFF) of the memory cell MC0 connected to the word line WL0, Vgs is small, and the on-state resistance Ron is large. In the selector SW (ON) of the non-selected memory cell on the source side of the selector SW (OFF) of the memory cell MC1, Vgs is large, and the on-state resistance Ron is small. In the same manner, in the example of FIG. 16B, in the selector SW (ON) of the non-selected memory cell on the drain side of the selector SW (OFF) of the memory cell MC7 connected to the word line WL7, Vgs is small, and the on-state resistance Ron is large. In the selector SW (ON) of the non-selected memory cell on the source side of the selector SW (OFF) of the memory cell MC7, Vgs is large, and the on-state resistance Ron is small. In the same manner, in the example of FIG. 16C, in the selector SW (ON) of the non-selected memory cell on the drain side of the selector SW (OFF) of the memory cell MC14 connected to the word line WL14, Vgs is small, and the on-state resistance Ron is large. In the selector SW (ON) of the non-selected memory cell on the source side of the selector SW (OFF) of the memory cell MC14, Vgs is large, and the on-state resistance Ron is small. As illustrated in FIGS. 16A to 16C, drain-source voltage differences VDS of the selectors SW (OFF) of the selected memory cells have the relationship of VDS1<VDS7<VDS14.

(Relationship between Voltage in Memory Cell String and Position of Selected Word Line WL)

Figure 17:
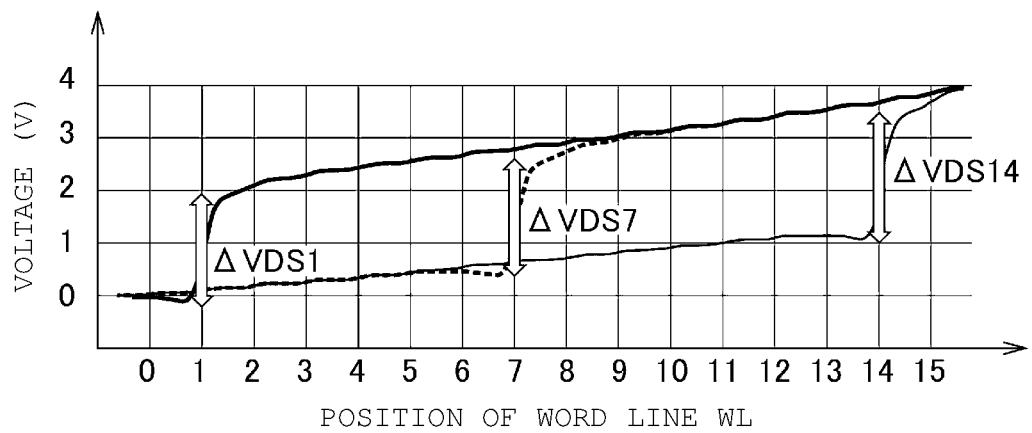
FIG. 17 is a diagram illustrating a voltage drop in the memory cell string at different positions along the memory string in the variable resistance nonvolatile memory according to the first embodiment.

FIG. 17 is a diagram illustrating a relationship between a voltage in a memory cell string and a position of the word line WL in the variable resistance nonvolatile memory according to the first embodiment. The voltage in the memory cell string can be defined as a voltage of a drain of each memory cell, by using a voltage of the source line SL as a zero potential. In FIG. 17, the position of the word line WL on the horizontal axis is represented as a continuous value.

In FIG. 17, the voltage drop across the memory cell MC1 in the case of selecting the word line WL1 is shown as ΔVDS1, the voltage drop across the memory cell MC1 in the case of selecting the word line WL7 is shown as ΔVDS7, and the voltage drop across the memory cell MC14 in the case of selecting the word line WL14 is shown as ΔVDS14. In the example of FIG. 17, ΔVDS1=2.03 V, ΔDSV7=2.17 V, and ΔDSV14=2.41 V. In FIG. 17, a voltage increase ΔV of the memory cell MC in the case of selecting the word line WL corresponds to the drain-source voltage difference VDS of the selected memory cell. In general, the drain-source voltage difference VDS represents the voltage drop across the memory cell MC when the word line WL connected to the memory cell MC is selected.

In FIG. 17, also in a WL non-selected state, as the transition from WL0 to WL15, the voltage in the memory cell string gradually increases. By changing the selected word line WL, the number of selected memory cells and memory cells on the source side thereof changes and the number of selected memory cells and memory cells on the drain side thereof changes. As the selected word line WL goes closer to WL15, the number of the selected memory cell and the number of memory cells on the source side thereof increases. The voltage drop across the non-selected memory cell on the source side of the selected memory cell is small, and the voltage drop across the non-selected memory cell on the drain side of the selected memory cell is large. Accordingly, as the selected WL is closer to the drain side, the sum of the voltage drops across the non-selected memory cells decreases, and the voltage drop across the selected memory cell increases.

In the variable resistance nonvolatile memory according to the first embodiment, a memory cell is selected by turning off the transistor, and a high voltage difference is applied across a portion of the variable resistance layer 31 of the memory cell, so that in an alloy-type phase transition element (GST: $Ge_2Sb_2Te_5$), for example, writing to a portion exceeding about 900K (making amorphous GST) can be performed. In the making of the amorphous GST, as the temperature is higher, the probability of crystallization increases. Therefore, it is required to lower the temperature of the non-selected memory cell and cause the temperature of the selected memory cell to be about 900K or more.

(Relationship Between Peak Temperature PT of Selected Memory Cell and Position of Selected Word Line WL)

Figure 18:
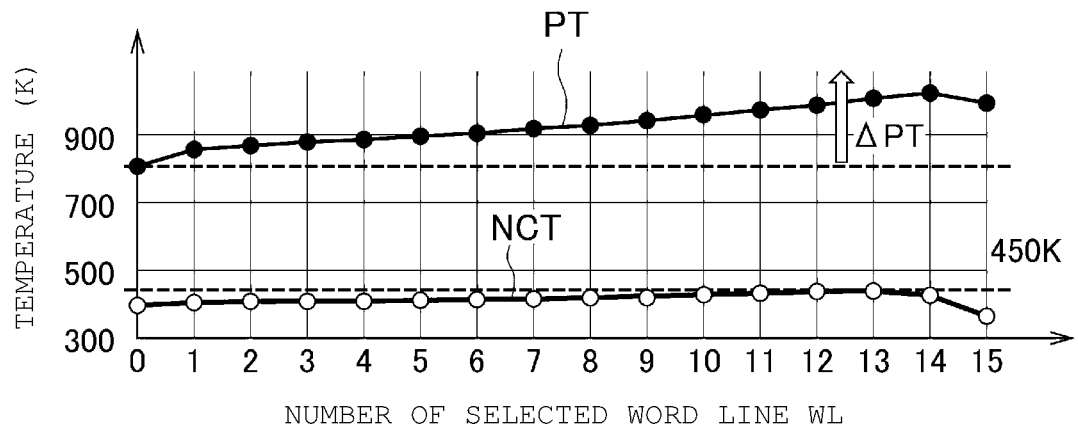
FIG. 18 is a diagram illustrating a relationship between a peak temperature of a selected memory cell and a position of the selected word line, and a relationship between a temperature of an adjacent memory cell and a position of the selected word line, in the variable resistance nonvolatile memory according to the first embodiment.

FIG. 18 is a diagram illustrating a relationship between a peak temperature PT of the selected memory cell and the number of the selected word lines WL, and a relationship between the temperature NCT of the memory cell adjacent to the selected memory cell and the number of the selected word lines WL, in the variable resistance nonvolatile memory according to the first embodiment. Here, the "peak temperature PT" is defined as the maximum temperature of the variable resistance layer in the selected memory cell. In addition, the "temperature NCT" of the memory cell adjacent to the memory cell is defined as a temperature exactly one cell (one pitch) adjacent to the position where the peak temperature PT is measured.

In FIG. 18, the peak temperature PT in the variable resistance layer 31 of a writing target selected by the selected word line WL increases as the transition to the selected word lines WL0 to WL15, as illustrated with an arrow ΔPT. This is because, as the selected word line WL is closer to the bit line BL, the voltage drop across the selected memory cell increases.

A tendency that the peak temperature increases as the selected word line WL is closer to the bit lines BL is found. The higher the peak temperature PT, the better. However, a peak temperature PT that is unnecessarily high may cause data disturbance in the adjacent memory cell (resulting in possible data destruction in the adjacent memory cell) or the like. Therefore, the peak temperature PT may be equal to or higher than the temperature at which data can be rewritten.

Figure 19:
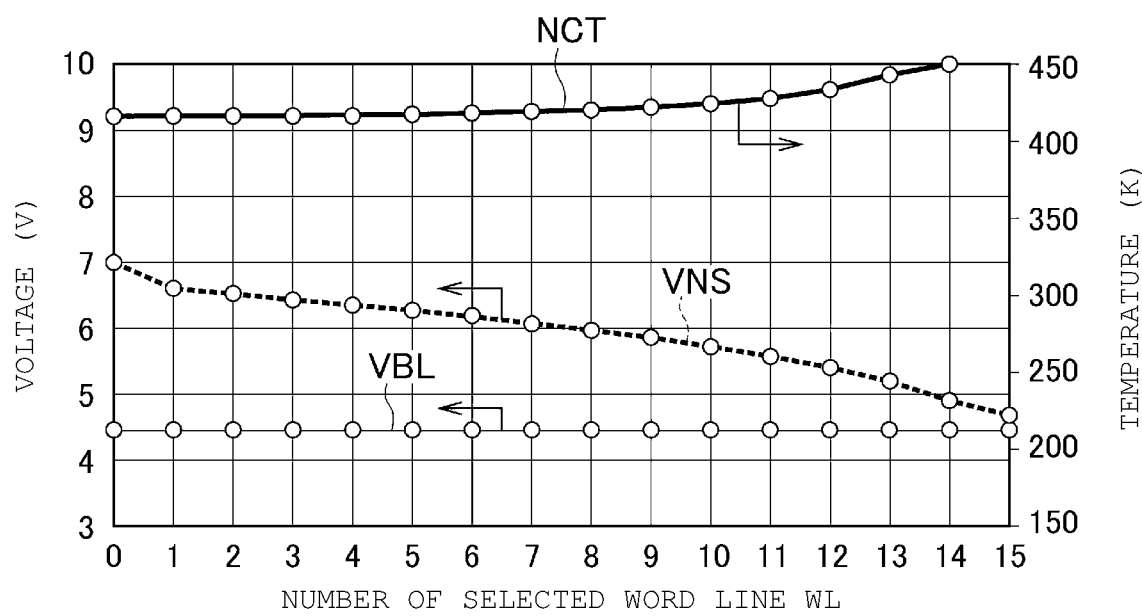
FIG. 19 is a diagram illustrating voltages (V) to be applied when an operation of changing a non-selected word line voltage according to a position of the selected word line in a state in which a bit line voltage is kept constant, is performed, and a relationship between the temperature of the adjacent memory cell and a position of the selected word line, in the variable resistance nonvolatile memory according to the first embodiment.

FIG. 19 is a diagram illustrating voltages (V) to be applied when an operation of changing a non-selected word line voltage VNS according to a position of the selected word line WL in a state in which a bit line voltage VBL is kept constant, is performed, and a relationship between a temperature NCT of the memory cell adjacent to the selected memory cell and a position of the selected word lines WL, in the variable resistance nonvolatile memory according to the first embodiment.

When the non-selected word line voltage VNS is decreased, the voltage drop ratio of the non-selected memory cell to the selected memory cell increases, and thus the adjacent memory cell temperature increases. The adjacent memory cell temperature gradually increases in the selected word lines WL9 to WL14 of FIG. 19 and becomes 450K in the word line WL14. The reason why the adjacent memory cell temperature NCT increases when the non-selected word line voltage VNS decreases is that the voltage drop ratio of the non-selected memory cell to the selected memory cell increases.

With reference to FIG. 19, in the state in which the bit line voltage VBL is substantially kept constant, as the selected word line WL is caused to be closer to the bit line BL side, the non-selected word line voltage VNS decreases. In the variable resistance nonvolatile memory according to the first embodiment, in a state in which the bit line voltage VBL is kept constant, by performing an operation of changing the non-selected word line voltage VNS according to the position of the selected word line WL, regardless of the position of the word line WL of the selected memory cell, the peak temperature PT can be kept, for example, to about 900K to remove the selected memory cell dependence.

The method of changing the WL voltage of the non-selected memory cell is described with reference to FIGS. 21 and 22. Further, the value of the WL voltage of the non-selected memory cell can be determined in advance based on experimental data or the like.

(Arrangement Configuration of Variable Resistance Nonvolatile Memory)

Figure 20:
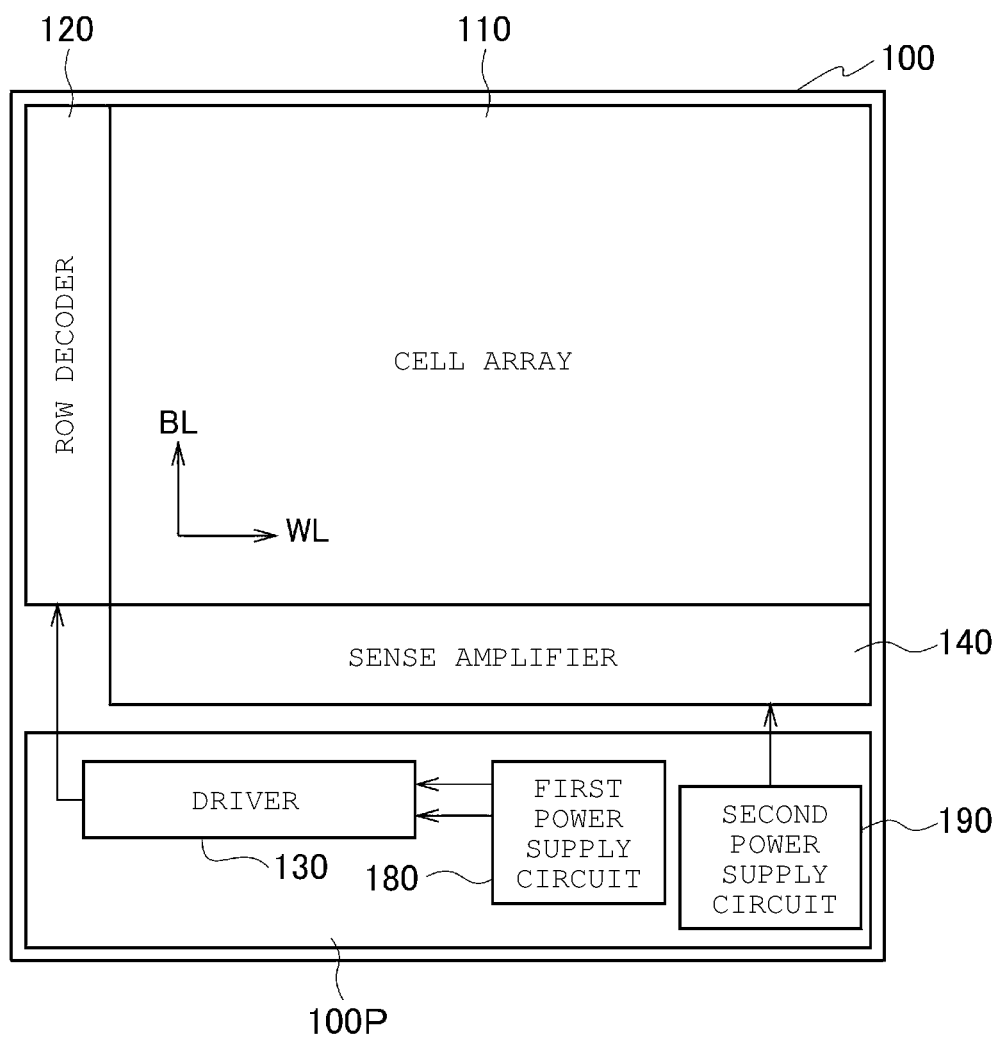
FIG. 20 is a diagram illustrating an arrangement configuration in the variable resistance nonvolatile memory according to the first embodiment.

FIG. 20 is a diagram illustrating an arrangement configuration of the variable resistance nonvolatile memory according to the first embodiment. The variable resistance nonvolatile memory according to the first embodiment includes the memory chip 100 as illustrated in FIG. 20. The memory cell array 110, the row decoder 120, and the sense amplifier 140 which are located around the periphery of the memory cell array 110, and a peripheral circuit 100P are mounted on the memory chip 100. The peripheral circuit 100P includes the driver circuit 130, the first power supply circuit 180, and the second power supply circuit 190. The peripheral circuit 100P includes the address register 150, the command register 160, and the sequencer 170, but illustration thereof is omitted. The driver circuit 130 may be incorporated into the row decoder 120.

Figure 21:
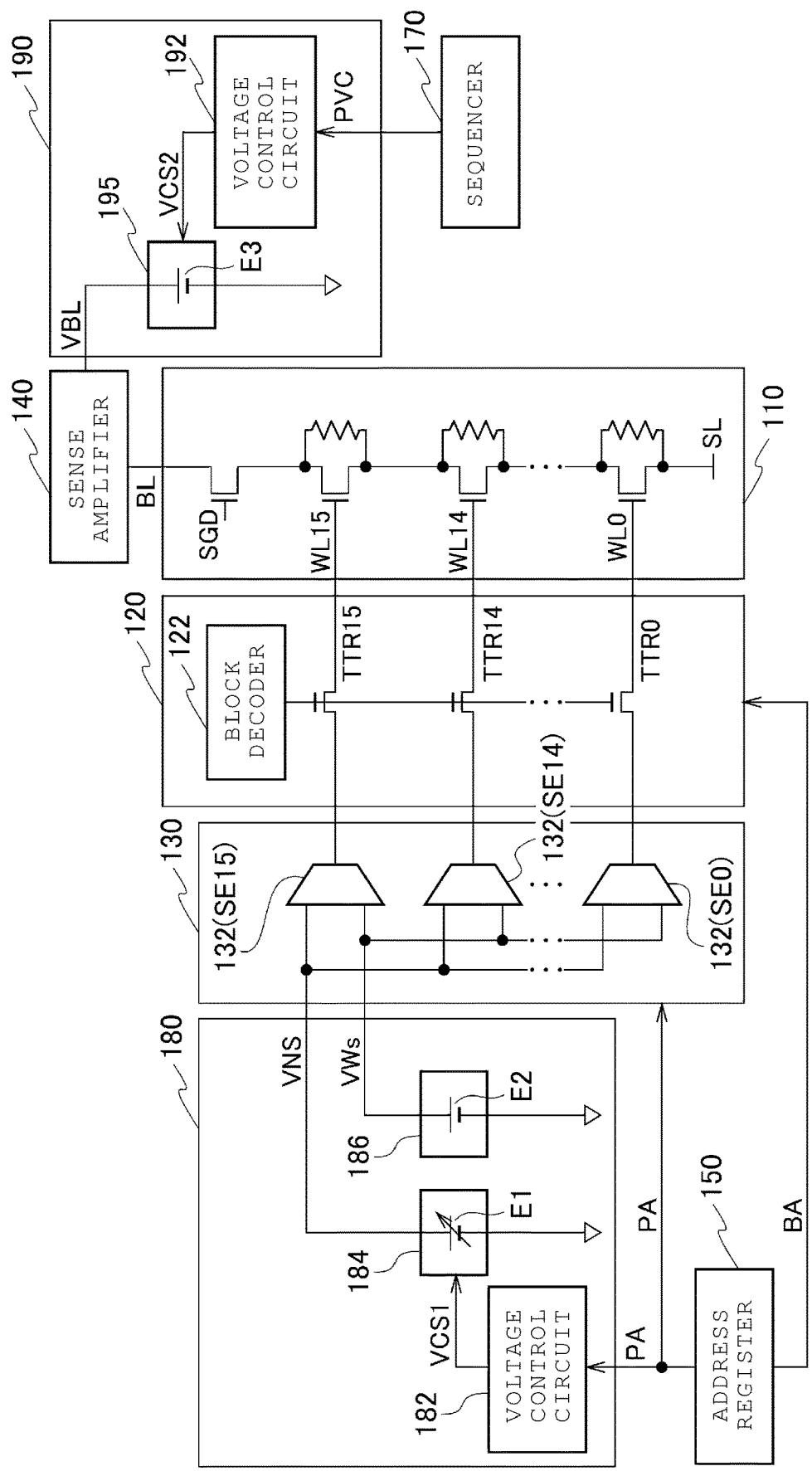
FIG. 21 is a diagram illustrating circuit configurations of peripheral circuits of the variable resistance nonvolatile memory according to the first embodiment.

FIG. 21 is a circuit diagram of the variable resistance nonvolatile memory according to the first embodiment. The variable resistance nonvolatile memory according to the first embodiment includes the first power supply circuit 180 and the second power supply circuit 190. The first power supply circuit 180 includes a first power supply 184, a second power supply 186, and a voltage control circuit 182 that controls the first power supply 184. The first power supply 184 can vary an output voltage E1 by a voltage control signal VCS1 supplied from the voltage control circuit 182. Therefore, the first power supply 184 outputs the non-selected word line voltage VNS to the driver circuit 130. On the other hands, the second power supply 186 can output the fixed voltage of an output voltage E2. The value of the output voltage E2 is, for example, about −2 V, and a selected word line voltage VWs is output to the driver circuit 130.

The driver circuit 130 includes a plurality of selectors 132(SE0) to 132(SE15). The non-selected word line voltage VNS and the selected word line voltage VWs can be supplied to the input of the selectors 132(SE0) to 132(SE15). The driver circuit 130 is connected to the address register 150. The driver circuit 130 receives the page address PA from the address register 150 and selects the word line that functions as the selected word line from among the word lines WL0 to WL15. The word line other than the selected word line functions as the non-selected word line.

The row decoder 120 includes a block decoder 122 and a plurality of transfer transistors TTR0 to TTR15. First terminals (sources) of the transfer transistors TTR0 to TTR15 are connected to the outputs of the selectors 132(SE0) to 132(SE15). Second terminals (drains) of the transfer transistors TTR0 to TTR15 are connected to the word lines WL0 to WL15 of the memory cell array 110.

The first power supply circuit 180 is connected to the address register 150, and can receive the page address PA from the address register 150, and output the non-selected word line voltage VNS and the selected word line voltage VWs. The page address PA may be referred to as a word line address (WA). The row decoder 120 is connected to the address register 150, receives the block address BA from the address register 150, selects any one of a plurality of blocks based on the block address BA, and further selects a word line in the selected block.

The second power supply circuit 190 includes a third power supply 195, and a voltage control circuit 192 that controls the third power supply 195. The second power supply circuit 190 is connected to the sense amplifier 140. The sense amplifier 140 is connected to the bit line BL. The third power supply 195 can output an output voltage E3 by a voltage control signal VCS2 supplied from the voltage control circuit 192. The output voltage E3 outputs the constant bit line voltage VBL. The constant bit line voltage VBL is supplied to the bit line BL via the sense amplifier 140 by this constant bit line voltage VBL. The second power supply circuit 190 is connected to the sequencer 170. Program verification cycle information PVC is supplied from the sequencer 170 to the voltage control circuit 192.

(Program Operation Waveform)

Figure 22:
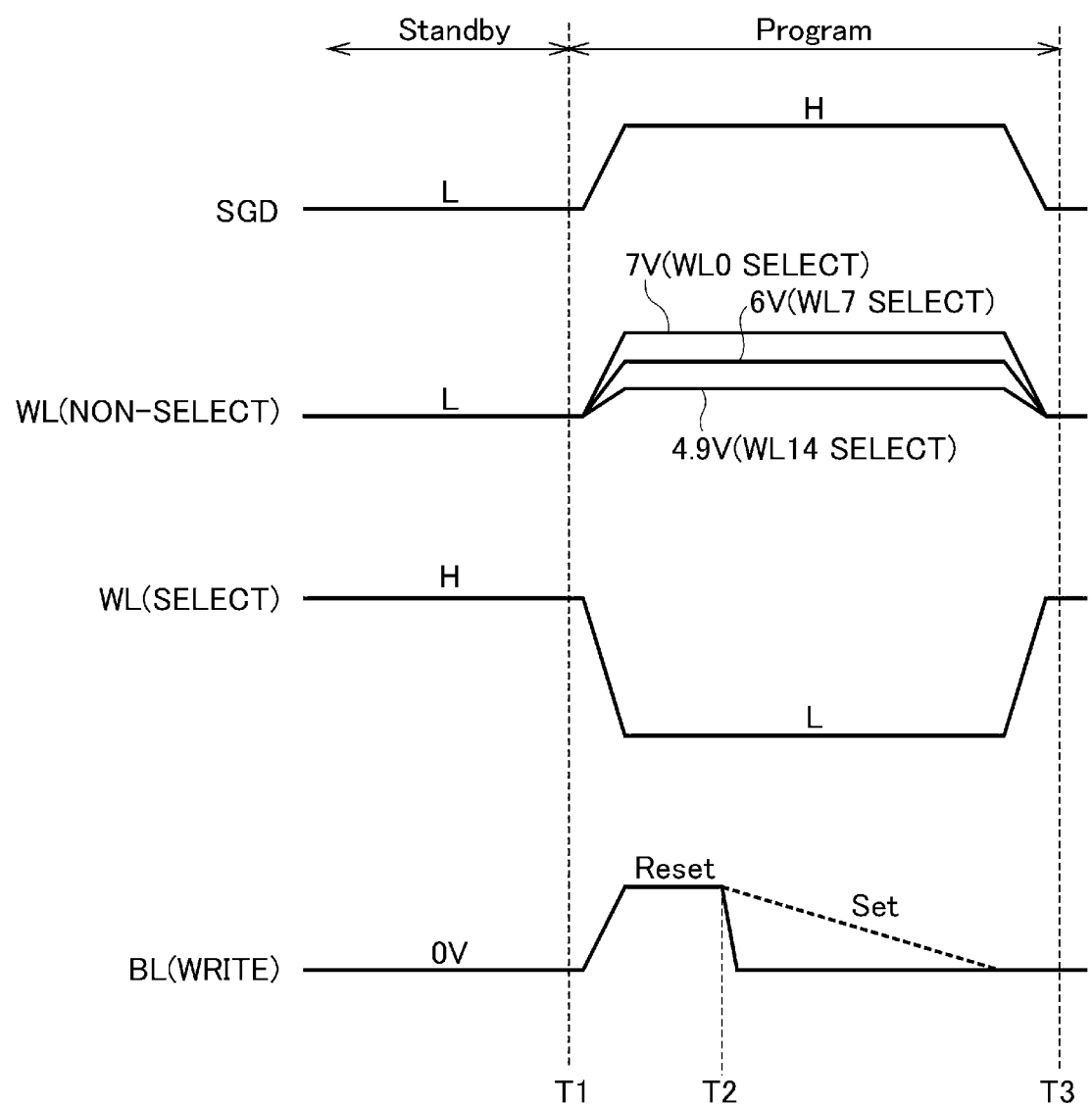
FIG. 22 is a diagram illustrating a program operation waveform when the non-selected word line voltage changes depending on the position of the selected word line in the variable resistance nonvolatile memory according to the first embodiment.

FIG. 22 is a program operation waveform when the non-selected word line voltage VNS is changed depending on the position of the selected word line WL in the variable resistance nonvolatile memory according to the first embodiment. First, in a stand-by state, according to the control of the sequencer 170, the voltage of the select gate line SGD of the select transistor ST corresponding to the selected memory cell MC is set as a low level L, the voltage of the non-selected word line WL (NON-SELECT) is set as the low level L, the voltage of the selected word line WL (SELECT) is set as a high level H, and the voltage of the bit line BL (WRITE) corresponding to the selected memory cell MC is set as the low level L.

Subsequently, in the program state during the period from the time T1 to time T3, the sequencer 170 raises the voltage of the select gate line SGD of the select transistor ST corresponding to the selected memory cell MC, from the L level to the H level. The voltage of the selected word line WL (SELECT) is lowered from the high level H to the low level L.

The sequencer 170 changes the voltage of the non-selected word line WL (NON-SELECT) from the low level L to a selected word line voltage VNS (FIG. 19). For example, VNS=7.0 V when the word line WL0 is selected, VNS=6.0 V when the word line WL7 is selected, and VNS=4.9 V when the word line WL14 is selected.

During the write operation, the sequencer 170 applies the writing pulse (voltage) to the bit line BL at the time T1 and rapidly decreases the pulse at the time T2, so that the reset state corresponding to a high resistance state is written. In addition, the sequencer 170 applies the writing pulse (voltage) to the bit line BL at the time T1 and slowly decreases the pulse at the time T2, so that the set state corresponding to a low resistance state is written.

Also, the sequencer 170 is set to the floating state after the voltage of the bit line BL is raised. Accordingly, the voltage of the bit line BL slowly decreases (the voltage is substantially maintained until the time T3) when the selected memory cell MC is in the high resistance state (reset), and the voltage of the bit lines BL rapidly decreases when the selected memory cell MC is in the low resistance state (set). The sense amplifier 140 senses the "H level/L level" of the voltage of the bit line BL after a certain period of time elapses from the application of the voltage to the bit line BL, to perform the read operation.

The variable resistance nonvolatile memory according to the first embodiment includes, for example, the first memory cell MC7 and the second memory cell MC14. The first memory cell MC7 includes the variable resistance layer 31 that extends in the Z direction orthogonal to the semiconductor substrate 20, the semiconductor layer 32 that extends in the Z direction and is in contact with the variable resistance layer 31, the insulator layer 33 that extends in the Z direction and is in contact with the semiconductor layer 32, and a first voltage applying electrode 22 (WL7) that extends in the Y direction orthogonal to the Z direction and is in contact with the insulator layer 33. The second memory cell MC14 includes a second voltage applying electrode 22 (WL14) that is located on the upper layer side (BL side) of the first voltage applying electrode 22 (WL7), extends in the Y direction, and is in contact with the insulator layer 33. The first voltage is applied to the second voltage applying electrode 22 (WL14) when the write operation is performed on the first memory cell MC7, and the second voltage is applied to the first voltage applying electrode 22 (WL7) when the write operation is performed on the second memory cell MC14. Here, the value of the first voltage is set to be larger than the value of the second voltage.

The variable resistance nonvolatile memory according to the first embodiment includes the select transistor ST1 including the semiconductor layer 32 that extends in the Z direction, the insulator layer 33 that extends in the Z direction and is in contact with the semiconductor layer 32, and a third voltage applying electrode 23 (SGD) that extends in the Y direction and is in contact with the insulator layer 33.

The variable resistance nonvolatile memory according to the first embodiment includes the memory cell string MS that includes the select transistor ST1, and the plurality of memory cells MC0 to MC15 in which the plurality of memory cells MC0 to MC15 are connected in series in the Z direction, the select transistor ST1 is connected to one end of the memory cell MC15 provided in a first end portion, and a fourth voltage applying electrode SL is connected to one end of the memory cell MC0 provided in a second end portion, and a fifth voltage applying electrode BL that is connected to the other end of the select transistor ST1 and extends in the X direction orthogonal to the Z direction and the Y direction orthogonal to the Z direction.

The variable resistance nonvolatile memory according to the first embodiment further includes the first power supply circuit 180 including the first power supply 184, the second power supply 186, and the voltage control circuit 182 that controls the first power supply 184. The first power supply 184 can output a variable voltage E1 by the first voltage control signal VCS1 supplied from the voltage control circuit 182 and output a first voltage VNS=6 V (WL7) and a second voltage VNS=4.9 V (WL14). The second power supply 186 can output a fixed voltage E2 and output the selected word line voltage VWs.

The variable resistance nonvolatile memory according to the first embodiment further includes the second power supply circuit 190 including the third power supply 195 and the voltage control circuit 192 that controls the third power supply 195. The third power supply 195 can supply a voltage E3 (VBL) of a constant value to the fifth voltage applying electrode BL by the second voltage control signal VCS2 supplied from the voltage control circuit 192.

The variable resistance nonvolatile memory according to the first embodiment further includes the sequencer 170 that selectively performs the read operation or the write operation by applying the voltage between the fifth voltage applying electrode BL and the fourth voltage applying electrode SL in a portion of the fifth voltage applying electrodes BL among the plurality of fifth voltage applying electrodes BL.

Effect of First Embodiment

In the variable resistance nonvolatile memory according to the first embodiment, by changing the voltage of the word line of the non-selected memory cell according to the position of the selected memory cell, regardless of the position of the word line of the selected memory cell, the peak temperature can be kept to a high temperature, and the selected memory cell dependence can be removed.

Second Embodiment

Figure 23:
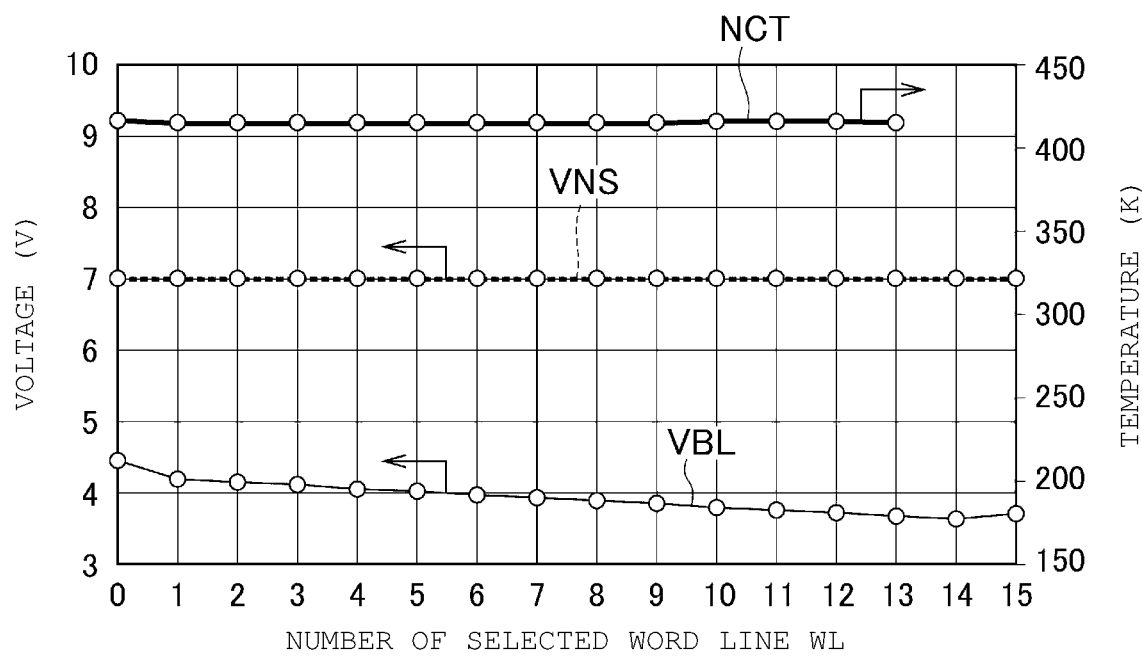
FIG. 23 is a diagram illustrating a relationship between a voltage when an operation of changing the bit line voltage according to the position of the selected word line is performed and the number of the selected word line and a relationship between the temperature of the adjacent memory cell and the number of the selected word line in a state in which the word line voltage is kept constant in the variable resistance nonvolatile memory according to a second embodiment.

FIG. 23 is a diagram illustrating a relationship between the voltage (V) when an operation of changing the bit line voltage VBL according to the position of the selected word lines WL and the number of the selected word lines WL, and a relationship between the temperature NCT of the memory cell adjacent to the selected memory cell and the number of the selected word lines WL in a state in which a word line voltage VNS is kept constant in the variable resistance nonvolatile memory according to a second embodiment. In the variable resistance nonvolatile memory according to the second embodiment, by changing the bit line voltage VBL, the peak temperature can be lowered without lowering the voltage of non-selected WL, the voltage drop ratio of the non-selected memory cell is decreased, and the temperature NCT of the adjacent memory cell can be controlled to be low. A cell current Icell decreases, as the selected WL goes closer to WL15, that is a BL voltage VBL decreases. The method of changing the bit line voltage VBL is described with reference to FIGS. 24 and 25. Further, the value of the bit line voltage VBL can be determined in advance based on experimental data or the like.

Figure 24:
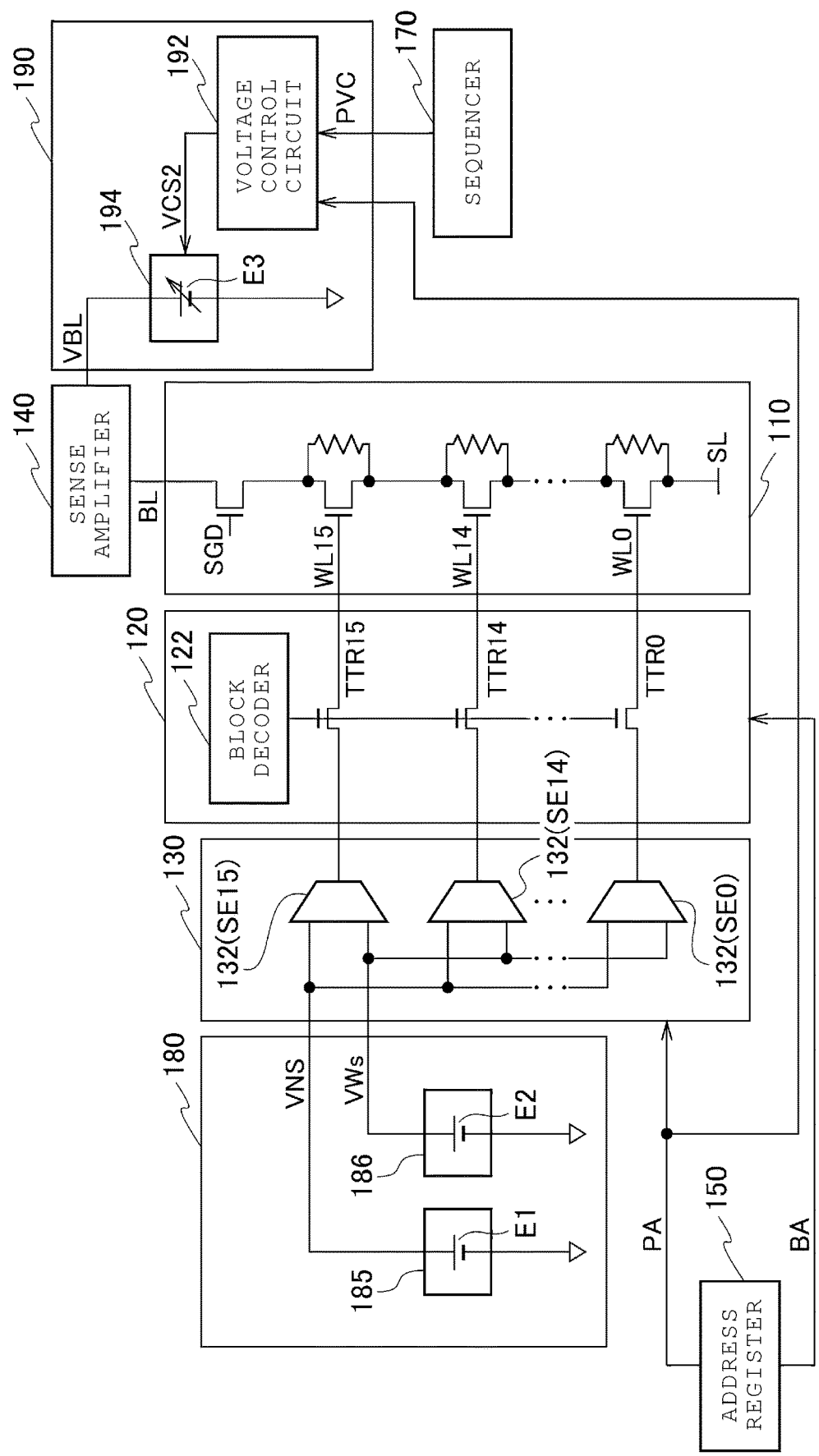
FIG. 24 is a diagram illustrating a circuit configuration of peripheral circuits in the variable resistance nonvolatile memory according to the second embodiment.

FIG. 24 is a circuit diagram of the variable resistance nonvolatile memory according to the second embodiment. The variable resistance nonvolatile memory according to the second embodiment includes the first power supply circuit 180 and the second power supply circuit 190.

The first power supply circuit 180 includes a first power supply 185 and the second power supply 186. The first power supply 185 can output a fixed voltage of the output voltage E1. The value of the output voltage E1 is, for example, about 7 V and outputs the non-selected word line voltage VNS to the driver circuit 130. However, the second power supply 186 can output the fixed voltage of the output voltage E2. The value of the output voltage E2 is, for example, about −2 V, and outputs the selected word line voltage VWs to the driver circuit 130.

The driver circuit 130 includes the plurality of selectors 132(SE0) to 132(SE15). The non-selected word line voltage VNS and the selected word line voltage VWs can be supplied to the input of the selectors 132(SE0) to 132(SE15). The driver circuit 130 is connected to the address register 150, and can receive the page address PA from the address register 150, and select the non-selected word line or the selected word line.

The row decoder 120 includes the block decoder 122 and the plurality of transfer transistors TTR0 to TTR15. The row decoder 120 is connected to the address register 150, receives the block addresses BA from the address register 150, selects any one of a plurality of blocks based on the block address BA, and further selects a word line in the selected block. First terminals (sources) of the transfer transistors TTR0 to TTR15 are connected to the outputs of the selectors 132(SE0) to 132(SE15). Second terminals (drains) of the transfer transistors TTR0 to TTR15 are connected to the word lines WL0 to WL15 of the memory cell array 110.

The first power supply circuit 180 is connected to the address register 150, and can receive the page address PA from the address register 150, and output the non-selected word line voltage VNS or the selected word line voltage VWs.

The second power supply circuit 190 includes a third power supply 194 and the voltage control circuit 192 that controls the third power supply 194. The second power supply circuit 190 is connected to the sense amplifier 140. The sense amplifier 140 is connected to the bit lines BL. The third power supply 194 can output the output voltage E3 by the voltage control signal VCS2 supplied from the voltage control circuit 192. The output voltage E3 has a variable value. By this variable value, the variable bit line voltage VBL is supplied to the bit line via the sense amplifier 140. The second power supply circuit 190 is connected to the sequencer 170. The program verification cycle information PVC is supplied from the sequencer 170 to the voltage control circuit 192. The voltage control circuit 192 is connected to the address register 150, and can receive the page address PA from the address register 150, and select the non-selected word line or the bit line BL corresponding to the selected word line. The voltage control circuit 192 changes the bit line voltage VBL based on program verification cycle information PVC and the page address PA.

In the variable resistance nonvolatile memory according to the second embodiment, a BL voltage of which the peak temperature becomes 900K is experimentally estimated, and thus it is possible to narrow down the range of the BL voltage applied in the program during the program verification cycle. The program verification cycle refers to a repeating operation of applying the program pulse, performing the write operation to the memory cell, and then performing the read operation for verifying the writing is able to be performed.

(Program Operation Waveform)

FIG. 25 is a program operation waveform diagram when the bit line voltage VBL is changed depending on the position of the selected word line WL in the variable resistance nonvolatile memory according to the second embodiment. First, in the stand-by state, by the control of the sequencer 170, the voltage of the select gate line SGD of the select transistor ST1 corresponding to the selected memory cell MC is set to the low level L, the voltage of the non-selected word line WL (NON-SELECT) is set to the low level L, the voltage of the selected word line WL (SELECT) is set to the high level H, and the voltage of the bit line BL (WRITE) corresponding to the selected memory cell MC is set to the low level L.

Subsequently, in the program state during the period from the time T1 to the time T3, the sequencer 170 raises the voltage of the select gate line SGD of the select transistor ST1 corresponding to the selected memory cell MC, from the L level to the H level. The voltage of the selected word line WL (SELECT) is lowered from the high level H to the low level L. The voltage of the non-selected word line WL (NON-SELECT) is raised from the low level L to the high level H.

In the write operation, the sequencer 170 applies the writing pulse (voltage) to the bit line BL at the time T1 and rapidly decreases the pulse at time T2, so that the reset state corresponding to a high resistance is written. The sequencer 170 applies the writing pulse (voltage) to the bit line BL at the time T1 and slowly decreases the pulse at the time T2 so that the set state corresponding to a low resistance is written.

The value of the bit line voltage VBL is changed according to FIG. 23. For example, VBL=4.50 V when the word line WL0 is selected, VBL=4.0 V when the word line WL7 is selected, and VBL=3.7 V when the word line WL14 is selected.

Also, the sequencer 170 is set to the floating state after the voltage of the bit line BL is raised. Accordingly, the voltage of the bit line BL slowly decreases (the voltage is substantially maintained until the time T3) when the selected memory cell MC is in the high resistance state (reset), and the voltage of the bit lines BL rapidly decreases when the selected memory cell MC is in the low resistance state (set). The sense amplifier 140 senses the "H level/L level" of the voltage of the bit line BL after a certain period of time elapses from the application of the voltage to the bit line BL, to perform the read operation.

The variable resistance nonvolatile memory according to the second embodiment includes, for example, the first memory cell MC7 and the second memory cell MC14. The first memory cell MC7 includes the variable resistance layer 31 that extends in the Z direction orthogonal to the semiconductor substrate 20, the semiconductor layer 32 that extends in the Z direction and is in contact with the variable resistance layer 31, the insulator layer 33 that extends in the Z direction and is in contact with the semiconductor layer 32, and the first voltage applying electrode 22 (WL7) that extends in the Y direction orthogonal to the Z direction and is in contact with the insulator layer 33. The second memory cell MC14 includes the second voltage applying electrode 22 (WL14) that is located on an upper layer side (BL side) of the first voltage applying electrode 22 (WL7), extends in the Y direction, and is in contact with the insulator layer 33.

The variable resistance nonvolatile memory according to the second embodiment includes the select transistor ST1 including the semiconductor layer 32 that extends in the Z direction, the insulator layer 33 that extends in the Z direction and is in contact with the semiconductor layer 32, and the third voltage applying electrode 23 (SGD) that extends in the Y direction and is in contact with the insulator layer 33, the memory cell string MS including the select transistor ST1 and the plurality of memory cells MC0 to MC15, in which the plurality of memory cells MC0 to MC15 are connected in series in the Z direction, the select transistor ST1 is connected to one end of the memory cell MC15 provided in the first end portion, and the fourth voltage applying electrode SL is connected to one end of the memory cell MC0 provided in the second end portion, and the fifth voltage applying electrode BL that is connected to the other end of the select transistor ST1, and extends in the X direction orthogonal to the Z direction and the Y direction orthogonal to the Z direction.

A third voltage VBL (WL7) is applied to the fifth voltage applying electrode BL when the write operation is performed on the first memory cell MC7, and a fourth voltage VBL (WL14) is applied to the fifth voltage applying electrode BL when the write operation is performed on the second memory cell MC14. Here, the value of the third voltage VBL (WL7) is set to be larger than the value of the fourth voltage VBL (WL14).

The first voltage VNS is applied to the first voltage applying electrode 22 (WL7) when the write operation is performed on the first memory cell MC7, and the second voltage VNS that has the same value as the first voltage VNS is applied to the second voltage applying electrode 22 (WL14) when the write operation is performed on the second memory cell MC14.

The variable resistance nonvolatile memory according to the second embodiment further includes the first power supply circuit 180 that includes the first power supply 185 and the second power supply 186. When outputting the fixed voltage E1, the first power supply 185 can output the first voltage VNS. The second power supply 186 can output the fixed voltage E2 and output the selected word line voltage VWs. The value of the selected word line voltage VWs is, for example, −2 V.

The variable resistance nonvolatile memory according to the second embodiment further includes the second power supply circuit 190 including the third power supply 194 and the voltage control circuit 192 that controls the third power supply 194. The third power supply 194 can supply the variable voltage E3 (VBL) to the fifth voltage applying electrode BL by the second voltage control signal VCS2 supplied from the voltage control circuit 192.

The sequencer 170 that selectively performs the read operation or the write operation by applying the voltage between the fifth voltage applying electrode BL and the fourth voltage applying electrode SL to a portion of the fifth voltage applying electrode BL among the plurality of fifth voltage applying electrode BL is further provided.

Effect of Second Embodiment

In the variable resistance nonvolatile memory according to the second embodiment, by changing the bit line voltage according to the position of the selected memory cell, regardless of the position of the word line WL of the selected memory cell, the peak temperature can be kept to be the high temperature, and the selected memory cell dependence can be removed.

In the variable resistance nonvolatile memory according to the second embodiment, regardless of the position of the word line WL of the selected memory cell, the voltage of non-selected WL can be caused to be constant, and thus the output circuit of the voltage of the non-selected WL (first power supply circuit) can be simplified.

In the variable resistance nonvolatile memories according to the first and second embodiments, specifically, the storage element MR of the memory cell MC may have a configuration including any one of (II) alternate stacking of GeTe and $Sb_2Te_3$ as interfacial phase transition elements, (III) alternate stacking of GeTe and BiSbTe as interfacial phase transition elements, (IV) alternate stacking of Ge, Sb, and Te, or a chalcogenide material, (V) TiOx, WOx, HfOx, or TaOx as a variable resistance film, and (V) a CoFe alloy and a NiFe alloy as an MTJ element, in addition to (I) the above alloy-type phase transition element ($Ge_2Sb_2Te_5$).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A variable resistance nonvolatile memory comprising:
   a first memory cell including
      a variable resistance layer that extends in a first direction above a semiconductor substrate,
      a first semiconductor layer that extends in the first direction and is in contact with the variable resistance layer,
      a first insulator layer that extends in the first direction and is in contact with the first semiconductor layer, and
      a first voltage applying electrode that extends in a second direction orthogonal to the first direction and is in contact with the first insulator layer; and
   a second memory cell including a second voltage applying electrode that is located above the first voltage applying electrode, extends in the second direction, and is in contact with the first insulator layer, wherein
   when a write operation is performed on the first memory cell, a first voltage is applied to the second voltage applying electrode, and
   when a write operation is performed on the second memory cell, a second voltage that is lower than the first voltage, is applied to the first voltage applying electrode.

2. The variable resistance nonvolatile memory according to claim 1, further comprising:
   a second semiconductor layer that extends in the first direction;
   a second insulator layer that extends in the first direction and is in contact with the second semiconductor layer; and
   a first select transistor including a third voltage applying electrode that extends in the second direction and is in contact with the second insulator layer.

3. The variable resistance nonvolatile memory according to claim 2, further comprising:
   a memory cell string that includes the first select transistor and a plurality of memory cells including the first and second memory cells, which are connected in series in the first direction, wherein the first select transistor is connected to a first end of the plurality of memory cells, and a fourth voltage applying electrode is connected to a second end of the plurality of memory cells; and a fifth voltage applying electrode that is above and connected to the first select transistor, and extends in a third direction orthogonal to the first direction and the second direction.

4. The variable resistance nonvolatile memory according to claim 3, further comprising:

a first power supply circuit that includes a first power supply, a second power supply, and a first voltage control circuit that controls the first power supply, wherein the first power supply is configured to output a variable voltage according to a first voltage control signal supplied from the first voltage control circuit, and the second power supply is configured to output a fixed voltage.

5. The variable resistance nonvolatile memory according to claim 4, wherein the first voltage that is applied to the second voltage applying electrode and the second voltage that is applied to the first voltage applying electrode are output by the first power supply according to the first voltage control signal supplied from the first voltage control circuit.

6. The variable resistance nonvolatile memory according to claim 5, wherein the fixed voltage is applied to the first voltage applying electrode when the first voltage is applied to the second voltage applying electrode, and the fixed voltage is applied to the second voltage applying electrode when the second voltage is applied to the first voltage applying electrode.

7. The variable resistance nonvolatile memory according to claim 4, further comprising:

a second power supply circuit that includes a third power supply, and a second voltage control circuit that controls the third power supply, wherein the third power supply is configured to supply a voltage of a constant value to the fifth voltage applying electrode according to a second voltage control signal supplied from the second voltage control circuit.

8. The variable resistance nonvolatile memory according to claim 7, further comprising:

a sequencer that is configured to control the first and second power supply circuits during the write operation.

9. A variable resistance nonvolatile memory comprising:

a first memory cell including
a variable resistance layer that extends in a first direction above a semiconductor substrate,
a first semiconductor layer that extends in the first direction and is in contact with the variable resistance layer,
a first insulator layer that extends in the first direction and is in contact with the first semiconductor layer, and
a first voltage applying electrode that extends in a second direction orthogonal to the first direction and is in contact with the first insulator layer; and a second memory cell including a second voltage applying electrode that is located above the first voltage applying electrode, extends in the second direction, and is in contact with the first insulator layer;

a second semiconductor layer that extends in the first direction;

a second insulator layer that extends in the first direction and is in contact with the second semiconductor layer;

a select transistor including a third voltage applying electrode that extends in the second direction and is in contact with the second insulator layer;

a memory cell string that includes the select transistor and a plurality of memory cells including the first and second memory cells, which are connected in series in the first direction, wherein the select transistor is connected to a first end of the plurality of memory cells, and a fourth voltage applying electrode is connected to a second end of the plurality of memory cells; and a fifth voltage applying electrode that is above and connected to the select transistor, and extends in a third direction orthogonal to the first direction and the second direction, wherein when a write operation is performed on the first memory cell, a first voltage is applied to the fifth voltage applying electrode, when a write operation is performed on the second memory cell, a second voltage that is lower than the first voltage, is applied to the fifth voltage applying electrode.

10. The variable resistance nonvolatile memory according to claim 9, wherein when a write operation is performed on the first memory cell, a third voltage is applied to the second voltage applying electrode, when a write operation is performed on the second memory cell, a fourth voltage that is equal to the third voltage, is applied to the first voltage applying electrode.

11. The variable resistance nonvolatile memory according to claim 10, further comprising:

a first power supply circuit that includes a first power supply and a second power supply, wherein the first power supply is configured to output a fixed voltage that is equal to the third voltage and the fourth voltage, and the second power supply is configured to output a fixed voltage that is equal to a selected word line voltage.

12. The variable resistance nonvolatile memory according to claim 11, further comprising:

a second power supply circuit that includes a third power supply and a voltage control circuit that controls the third power supply, and the third power supply is configured to output a variable voltage according to a voltage control signal supplied from the voltage control circuit.

13. The variable resistance nonvolatile memory according to claim 12, wherein the first voltage that is applied to the fifth voltage applying electrode and the second voltage that is applied to the fifth voltage applying electrode are output by the third power supply according to the voltage control signal supplied from the voltage control circuit.

14. The variable resistance nonvolatile memory according to claim 9, further comprising:

a sequencer that is configured to control the first and second power supply circuits during the write operation.

15. A method of performing a write operation in a variable resistance nonvolatile memory including a first memory cell including a variable resistance layer that extends in a first direction above a semiconductor substrate, a first semiconductor layer that extends in the first direction and is in contact with the variable resistance layer, a first insulator layer that extends in the first direction and is in contact with the first semiconductor layer, and a first word line that extends in a second direction orthogonal to the first direction and is in contact with the first insulator layer, a second memory cell including a second word line that is located above the first word line, extends in the second direction, and is in contact with the first insulator layer, and a bit line connected to the first and second memory cells, said method comprising:

applying a first voltage to the second word line and a second voltage to the bit line, when a write operation is performed on the first memory cell, and applying a third voltage to the first word line and a fourth voltage to the bit line, when a write operation is performed on the second memory cell, wherein the first voltage and third voltage are the same voltage and the second voltage and fourth voltage are different voltages, or the first voltage and third voltage are different voltages and the second voltage and fourth voltage are the same voltage.

16. The method according to claim 15, wherein the first voltage is greater than the second voltage.

17. The method according to claim 15, wherein the second voltage is greater than the fourth voltage.

18. The method according to claim 15, further comprising:

applying a fifth voltage to the first word line when the first voltage is applied to the second word line and to the second word line when the third voltage is applied to the first word line.

19. The method according to claim 15, further comprising:

applying a fifth voltage to a third word line that is between the first and second word lines, when the write operation is performed on the first memory cell applying a sixth voltage that is lower than the fifth voltage, to the third word line, when the write operation is performed on the second memory cell.

20. The method according to claim 19, wherein the fifth voltage is equal to the first voltage and the sixth voltage is equal to the second voltage.

* * * * *